(12) United States Patent
Akiba et al.

(10) Patent No.: US 12,384,308 B2
(45) Date of Patent: Aug. 12, 2025

(54) ELECTRONIC CONTROL DEVICE

(71) Applicant: Hitachi Astemo, Ltd., Hitachinaka (JP)

(72) Inventors: Ryo Akiba, Hitachinaka (JP); Yoshio Kawai, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 269 days.

(21) Appl. No.: 18/030,252

(22) PCT Filed: Sep. 22, 2021

(86) PCT No.: PCT/JP2021/034805
§ 371 (c)(1),
(2) Date: Apr. 4, 2023

(87) PCT Pub. No.: WO2022/091652
PCT Pub. Date: May 5, 2022

(65) Prior Publication Data
US 2023/0380080 A1    Nov. 23, 2023

(30) Foreign Application Priority Data

Oct. 29, 2020    (JP) .................................. 2020-181011

(51) Int. Cl.
| | |
|---|---|
| B60R 16/02 | (2006.01) |
| H05K 5/00 | (2006.01) |
| H05K 5/02 | (2006.01) |

(52) U.S. Cl.
CPC ........... B60R 16/02 (2013.01); H05K 5/0065 (2013.01); H05K 5/0073 (2013.01); H05K 5/0217 (2013.01); H05K 5/0247 (2013.01)

(58) Field of Classification Search
CPC .................................... B60R 16/02
USPC ......................................................... 361/748
See application file for complete search history.

(56) References Cited

U.S. PATENT DOCUMENTS

2018/0222408 A1* 8/2018 Shigyo ................ B60R 16/0239

FOREIGN PATENT DOCUMENTS

| JP | 2009-64895 A | | 3/2009 |
|---|---|---|---|
| JP | 2012-200061 A | | 10/2012 |
| JP | 2016-129182 | * | 7/2016 |
| JP | 2016-129182 A | | 7/2016 |
| JP | 2017 17095 | * | 1/2017 |
| JP | 2017-17096 A | | 1/2017 |

(Continued)

OTHER PUBLICATIONS

International Search Report (PCT/ISA/210) issued in PCT Application No. PCT/JP2021/034805 dated Dec. 14, 2021 with English translation (five (5) pages).

(Continued)

*Primary Examiner* — Stanley Tso
(74) *Attorney, Agent, or Firm* — Crowell & Moring LLP

(57) ABSTRACT

There is provided an electronic control device fixed to an in-vehicle device to be controlled. The electronic control device is a unit that includes a base attached to the in-vehicle device, a case fixed to the base, a circuit board held by the case, and an electronic component mounted on the circuit board. At least one of the case and the base is made of a resin, the case and the base are fixed with a plurality of fixing screws, and the case and the base are fixed by an adhesive disposed away from the plurality of fixing screws.

13 Claims, 20 Drawing Sheets

(56) References Cited

FOREIGN PATENT DOCUMENTS

JP         6636363 B2    1/2020
WO    WO 2017/038316 A1    3/2017

OTHER PUBLICATIONS

Japanese-language Written Opinion (PCT/ISA/237) issued in PCT Application No. PCT/JP2021/034805 dated Dec. 14, 2021 (four (4) pages).
International Preliminary Report on Patentability (PCT/IB/338 & PCT/IB/373) issued in PCT Application No. PCT/JP2021/034805 dated May 11, 2023, including English translation of document C2 (Japanese-language Written Opinion (PCT/ISA/237), filed on Apr. 4, 2023) (6 pages).

* cited by examiner

ELECTRONIC CONTROL DEVICE

TECHNICAL FIELD

The present invention relates to an electronic control device that is fixed and attached to an in-vehicle device such as a transmission or an engine.

BACKGROUND ART

In an electronic control device that controls in-vehicle devices such as a transmission, an engine, a brake, and a motor, a board of an electronic component is generally held by a case made of metal (alloy) (see PTL 1).

CITATION LIST

Patent Literature

PTL 1: JP 6636363 B

SUMMARY OF INVENTION

Technical Problem

In recent years, the number of electronic control devices mounted on vehicles tends to increase, and integration (electromechanical integration) of an in-vehicle electronic control device with an in-vehicle device has been advanced from the viewpoint of significantly reducing the length of a connection cable with the in-vehicle device to be connected. Specifically, there are integration of an engine and an electronic control device, integration of a transmission and an electronic control device, and the like. However, the surface temperature during an operation of the in-vehicle device such as the transmission may reach about 130° C. to 140° C. In such a configuration in which such a high-temperature in-vehicle device and an electronic control device are integrated, heat from the in-vehicle device to an electronic component included in the electronic control device is largely transferred. Thus, there is a concern that, when the electronic control device is operated, the electronic component rises in temperature to exceed a heat-resistant temperature. Therefore, it is conceivable to change the material of a case that supports the board of the electronic component among the components of the electronic control device to a resin so as to suppress the heat transfer from the in-vehicle device to the electronic component.

On the other hand, when the electronic control device is attached to the in-vehicle device, the mechanical vibration of the in-vehicle device is directly transmitted to the electronic control device. When the case of the electronic control device is changed to a resin having material strength lower than the material strength of metal, it is necessary to fix the case to the body of the in-vehicle device with a sufficient number of screws from the viewpoint of vibration resistance.

However, it is difficult to completely eliminate a manufacturing error of the case, and a resin case having a manufacturing error is deformed when screwed in many points. As a result, distortion occurs in a circuit board fixed to the case, a load is applied to the soldered portion that connects the circuit board and the electronic component mounted on the circuit board, and thus the life of the soldered portion is reduced. From the viewpoint of suppressing the load applied to the soldered portion, it is actually difficult to increase the number of screwed portions of the case of the electronic control device.

An object of the present invention is to provide an electronic control device capable of achieving both vibration resistance and a life of a soldered portion of an electronic component.

Solution to Problem

In order to achieve the above object, the present invention provides an electronic control device fixed to an in-vehicle device to be controlled. The electronic control device is a unit that includes a base attached to the in-vehicle device, a case fixed to the base, a circuit board held by the case, and an electronic component mounted on the circuit board. At least one of the case and the base is made of a resin, the case and the base are fixed with a plurality of fixing screws, and the case and the base are fixed by an adhesive disposed away from the plurality of fixing screws.

Advantageous Effects of Invention

According to the present invention, it is possible to achieve both the vibration resistance of an electronic control device and the life of the soldered portion of an electronic component.

DESCRIPTION OF EMBODIMENTS

An electronic control device according to each embodiment exemplified in the present specification is, for example, a device that outputs a command signal to an actuator (for example, an electromagnetic valve) of an in-vehicle device to be controlled, based on a signal from a sensor or an input signal from another control device. The electronic control device according to each embodiment is fixedly attached to the body of the in-vehicle device to be controlled. The in-vehicle device is a device mounted on a vehicle such as a passenger car, and is, for example, a transmission, an engine, a brake, a motor, or the like. Hereinafter, embodiments of the present invention will be described with reference to the drawings. In each embodiment, the same or corresponding elements are denoted by the same reference signs, and repetitive description will be omitted as appropriate.

First Embodiment

—In-Vehicle Device—

Figure 1:
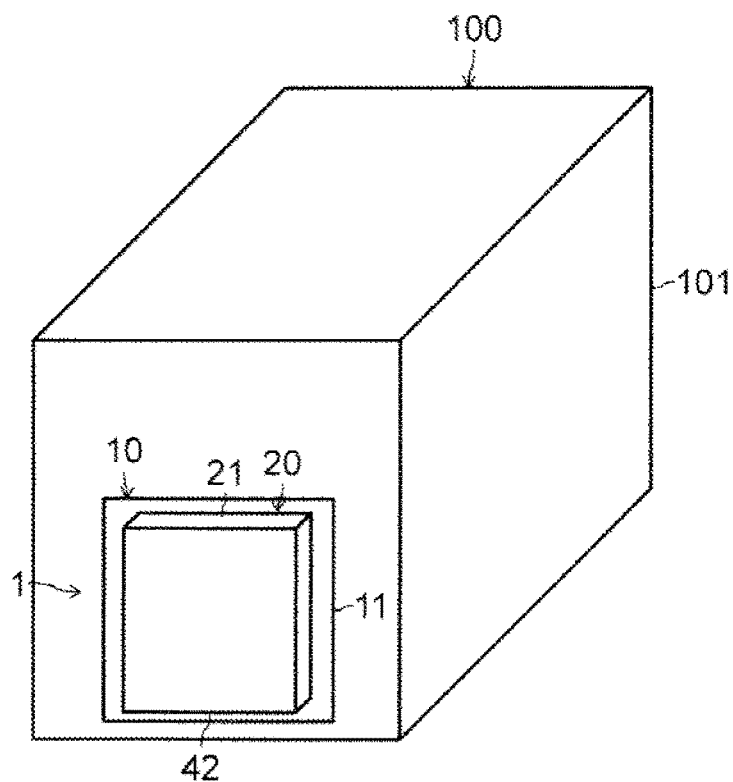
FIG. 1 is a perspective view schematically illustrating an in-vehicle device to which an electronic control device according to the present invention is attached.

FIG. 1 is a perspective view schematically illustrating an in-vehicle device to which an electronic control device according to the present invention is attached. An in-vehicle device 100 illustrated in FIG. 1 is, for example, a transmission, and transmits power of a prime mover such as an engine to an active shaft while changing torque, a rotation speed, and a rotation direction. The in-vehicle device 100 includes a mechanism section (not illustrated) including a gear, a shaft, and the like, and a body 101 which is an outer frame for accommodating the mechanism section. The body 101 incorporates a tank of lubricating oil that lubricates the mechanism section. An electronic control device 1 is fixed and attached to the body 101 of the in-vehicle device 100. In this example, the electronic control device 1 is, for example, a transmission control unit (TCU). In this manner, the in-vehicle device 100 and the electronic control device 1 constitute one unit, and are mechanically and electrically integrated. The in-vehicle device 100 and the electronic control device 1 are disposed, for example, in an engine room (not illustrated) of a vehicle.

Figure 2:
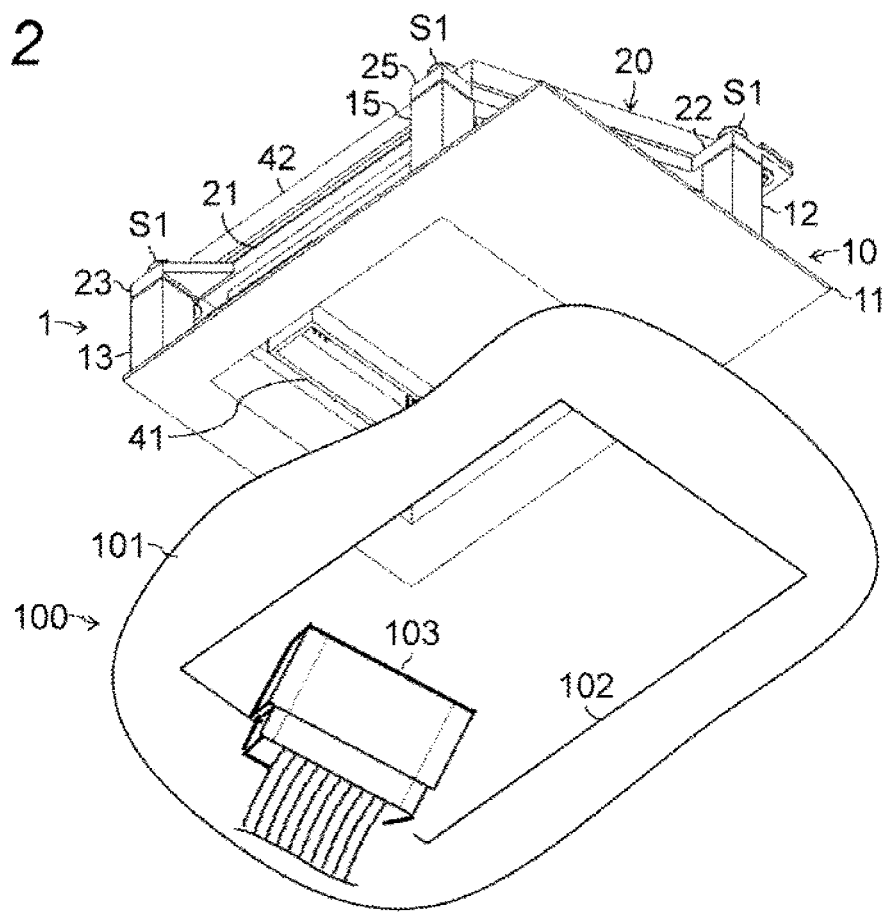
FIG. 2 is a perspective exploded view illustrating a portion of a body of the in-vehicle device illustrated in FIG. 1, to which the electronic control device is attached, as viewed from the inside of the body.

FIG. 2 is a perspective exploded view illustrating a portion of the body 101 of the in-vehicle device 100 to which the electronic control device 1 is attached, as viewed from the inside of the body 101. As illustrated in FIG. 2, an opening 102 is formed in the portion of the body 101 of the in-vehicle device 100 to which the electronic control device 1 is attached. A connector 103 at a tip of a cable extending from an actuator (not illustrated) of the in-vehicle device 100 faces the opening 102. The shape of the opening 102 is not particularly limited, and the opening 102 is formed in a rectangular shape in the example of FIG. 2. The connector 103 is pulled out from the body 101 of the in-vehicle device 100 through the opening 102 and connected to a connector 41 (described later) of the electronic control device 1 to close the opening 102. Thus, the electronic control device 1 is attached to the body 101. The electronic control device 1 is fixed and attached to the body 101 of the in-vehicle device 100 with a plurality of attachment screws (not illustrated). The electronic control device 1 also serves as a cover that closes the opening 102 of the body 101. The electronic control device 1 and the actuator of the in-vehicle device 100 are electrically connected via the connectors 41 and 103, and an electric signal is transmitted between the electronic control device 1 and the in-vehicle device 100. By integrating the electronic control device 1 and the in-vehicle device 100, the length of the cable that connects the electronic control device 1 and the in-vehicle device 100 is suppressed. Since the connection cable with the electronic control device 1 from the in-vehicle device 100 does not come out, it is not necessary to route the cable that connects the in-vehicle device 100 and the electronic control device 1, in the vehicle.

—Electronic Control Device—

Figure 3:
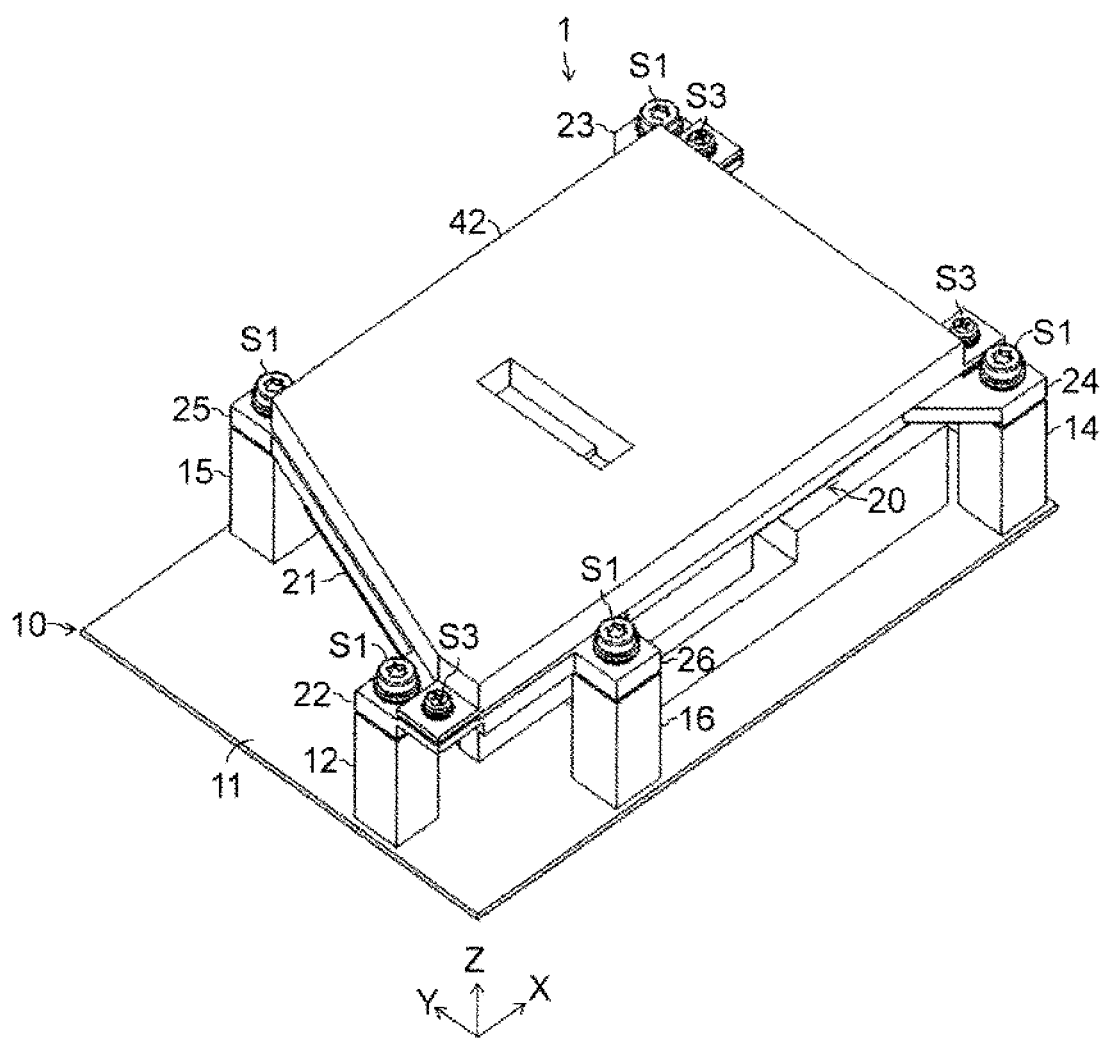
FIG. 3 is a perspective view of an electronic control device according to a first embodiment of the present invention.
Figure 4:
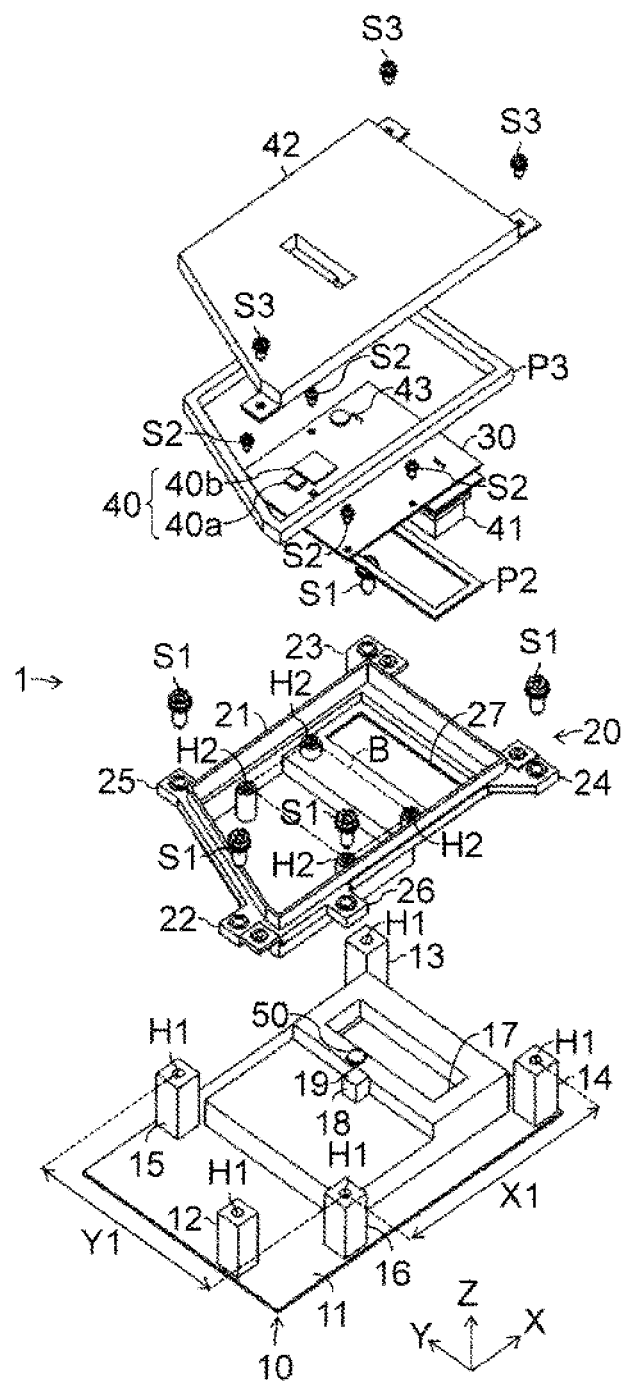
FIG. 4 is an exploded perspective view of the electronic control device according to the first embodiment of the present invention.
Figure 5:
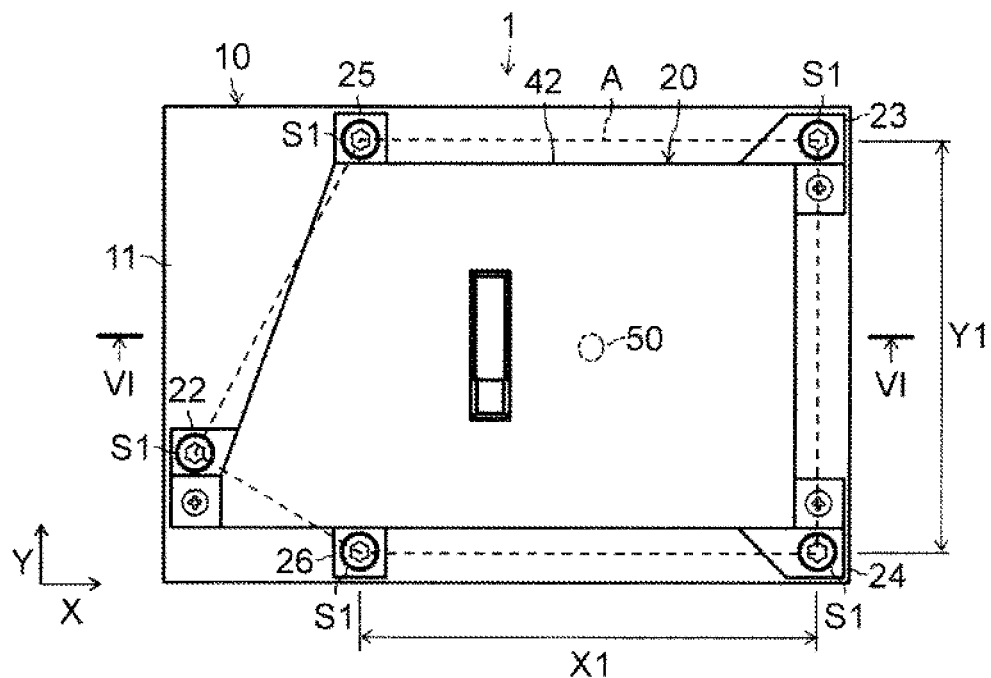
FIG. 5 is a plan view of the electronic control device according to the first embodiment of the present invention.
Figure 6:
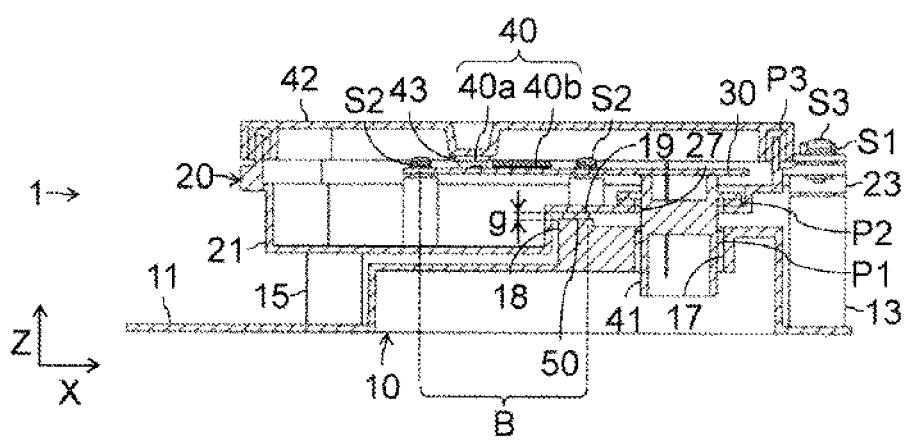
FIG. 6 is a cross-sectional view of the electronic control device taken along line VI-VI in FIG. 5.

FIG. 3 is a perspective view of the electronic control device according to the first embodiment of the present invention. FIG. 4 is an exploded perspective view of the electronic control device. FIG. 5 is a plan view of the electronic control device. FIG. 6 is a cross-sectional view of the electronic control device taken along line VI-VI in FIG.

5. The electronic control device 1 illustrated in FIGS. 3 to 6 is a unit fixed to the in-vehicle device 100 (FIG. 1) to be controlled, and includes a base 10, a case 20, a circuit board 30, an electronic component 40, and an adhesive 50.

Base

The base 10 is a base structure of the electronic control device 1, and is fixed and attached to the body 101 of the in-vehicle device 100 with a plurality of attachment screws (not illustrated). For example, a rubber packing (not illustrated) is interposed between the base 10 and the body 101, and waterproofness and airtightness between the base 10 and the body 101 are improved. In the first to twelfth embodiments, the base 10 is assumed to be made of metal, but may be made of a resin.

As illustrated in FIG. 4, the base 10 includes a plate 11, screw seats 12 to 16, a connector hole 17, and an adhesive seat 18. The plate 11 is a main body of the base 10, and also serves as a cover that closes the opening 102 (FIG. 2) of the body 101 of the in-vehicle device 100. The plate 11 is provided with a plurality of through holes (not illustrated) through which the attachment screws (not illustrated) for attaching the electronic control device 1 to the body 101 of the in-vehicle device 100 pass, at appropriate positions on the edge. A plurality of (five in this example) screw bases 12-16 protrude upward from the plate 11 in a layout corresponding to the shape of the case 20. Each of the screw seats 12 to 16 has an upper end surface as a smooth seat surface on which the case 20 is seated, and a screw hole H1 is provided in each seat surface as illustrated in FIG. 4. A fixing screw S1 is screwed into the screw hole H1.

A region A (FIG. 5) surrounded by the screw holes H1 or the fixing screws S1 of the screw seats 12 to 16 has different dimensions in an X-axis direction and a Y-axis direction in plan view (as viewed downward in a Z-axis direction in FIG. 4) due to the shapes of the electronic control device 1 and the in-vehicle device 100 and the convenience of competition. That is, the region A has a longitudinal direction (X-axis direction in FIG. 4) and a lateral direction (Y-axis direction in FIG. 4). In addition, the pitch between the fixing screws S1 (described later) is also unequal, and the maximum pitch X1 of the screw holes H1 or the fixing screws S1 in the longitudinal direction is greater than the maximum pitch Y1 of the screw holes H1 or the fixing screws S1 in the lateral direction (X1>Y1). In the present embodiment, the region A is a pentagonal region in which the screw holes H1 (fixing screws S1) of the screw seats 12 to 16 are used as vertices (FIG. 5).

Further, the base 10 includes a seat surface 19 facing the case 20 with a gap interposed therebetween, in a region (that is, the region A) surrounded by the plurality of fixing screws S1. Specifically, the adhesive seat 18 mentioned above is located in the region A in plan view, and protrudes from the plate 11 side toward the case 20. An end surface of the adhesive seat 18, that faces the case 20 (in this example, an upper surface facing an upper side in the Z-axis direction), is the seat surface 19, and the dimension of the adhesive seat 18 in the Z-axis direction is set such that a slight gap is secured between the seat surface 19 and the case 20. In the present embodiment, there is only one adhesive seat 18 and one seat surface 19 for one electronic control device 1.

The connector hole 17 is an opening through which the connector 41 (described later) passes, and has a layout of being housed in the region A in plan view. In the present embodiment, the connector hole 17 is located on the opposite side (right side in FIG. 6) to the electronic component 40 across the seat surface 19 of the adhesive seat 18 in the X-axis direction. A seal member P1 (FIG. 6) is interposed between the connector 41 and the connector hole 17, and waterproofness and airtightness between the connector 41 and the connector hole 17 are improved. The seal member P1 is, for example, rubber packing.

Case

The case 20 is a component that houses the circuit board 30 and the electronic component 40, and is fixed to the base 10. The case 20 and the base 10 are fixed with a plurality of (five in the present embodiment) fixing screws S1. In the first to twelfth embodiments, the case 20 is made of a resin. When the base 10 is made of a resin, the case 20 may be made of metal.

As illustrated in FIG. 4, the case 20 includes a main body 21, brackets 22 to 26, and a connector hole 27. The main body 21 of the case 20 is a thin dish-shaped member that accommodates and holds the circuit board 30 and the electronic component 40. The brackets 22 to 26 are provided to protrude from the outer peripheral portion of the main body 21 of the case 20, corresponding to the screw seats 12 to 16. The case 20 is fixed to the base 10 by inserting the fixing screw S1 into insert collars of the brackets 22 to 26 and screwing the fixing screw S1 into the screw holes H1 of the screw seats 12 to 16.

The main body 21 of the case 20 includes a plurality of (four in this example) screw holes H2 into which board screws S2 being board fixing screws for fixing the circuit board 30 are screwed. The screw hole H2 into which the board screw S2 is screwed is disposed to surround the electronic component 40 in plan view, and has a layout in which the electronic component 40 is housed in a region B surrounded by the board screws S2 (a quadrangular region with each board screw S2 as a vertex) in plan view.

The connector hole 27 is an opening through which the connector 41 (described later) passes. The connector hole 27 is located outside the region B while being housed in the region A in plan view, and is located to be shifted in the X-axis direction (right side in FIG. 6) with respect to the region B. The connector hole 27 overlaps the connector hole 17 of the base 10 in plan view. A seal member P2 is interposed between the connector 41 and the connector hole 27, and waterproofness and airtightness between the connector 41 and the connector hole 27 are improved. The seal member P2 is, for example, an adhesive.

Circuit Board/Electronic Component

The circuit board 30 is held by the case 20. The electronic component 40 and the connector 41 are mounted on the circuit board 30. The circuit board 30 is fixed to the case 20 by inserting the board screw S2 into the circuit board 30 and screwing the board screw S2 into the screw hole H2 of the case 20. The electronic component 40 is mounted on the circuit board 30. In the present embodiment, the electronic component 40 includes a QFN package (Quadflat no lead package) 40a and a BGA (Ball grid array) package 40b. Although not illustrated, the electronic component 40 mounted on the circuit board 30 may include at least one other electronic component in addition to the QFN package 40a and the BGA package 40b. As described above, the electronic component 40 (including the QFN package 40a and the BGA package 40b) is laid out to be housed in the region B surrounded by the board screw S2 in plan view, and the connector 41 is disposed away from the region B.

The connector 41 is coupled to the connector 103 (FIG. 2) at a tip of a cable extending from an actuator (not illustrated) of the in-vehicle device 100, and electrically connects an electric circuit formed on the circuit board 30 and the in-vehicle device 100.

The circuit board 30, the electronic component 40, and the connector 41 are covered by a metal cover 42. The cover 42 is attached to the case 20 with a plurality of (three in this example) cover screws S3. A seal member P3 is interposed between the cover 42 and the case 20, and waterproofness and airtightness between the cover 42 and the case 20 are improved. The seal member P3 is, for example, an adhesive. In addition, the cover 42 is in contact with the electronic component 40 via a heat conductive material 43 (FIGS. 4 and 6). The heat conductive material 43 is, for example, grease. The heat of the electronic component 40 escapes to the cover 42 made of metal via the heat conductive material 43, and is dissipated from the cover 42, thereby the temperature rise of the electronic component 40 is suppressed. In the present embodiment, for the same purpose, the circuit board 30 is also partially in contact with the cover 42 via the heat conductive material 43 (see also FIG. 20).

Adhesive

The adhesive 50 is a member for improving the vibration resistance of the electronic control device 1, unlike, for example, an adhesive for sealing used for the seal members P2 and P3. Therefore, the adhesive 50 does not have an annular shape surrounding the opening (the connector holes 17 and 27) unlike the seal members P2 and P3, and is applied in a solid point shape having a certain area in the present embodiment. However, in the present embodiment, the material of the adhesive 50 is the same as the material of the adhesive used for the seal members P2 and P3.

A gap g (FIG. 6) between the smooth seat surface 19 of the adhesive seat 18 of the base 10 and a smooth lower surface (portion) of the case 20 is filled with the adhesive 50. Thus, the adhesive 50 bonds the case 20 and the base 10 to fix the case 20 and the base 10 to each other. In the present embodiment, the adhesive 50 is disposed away from each fixing screw S1. The adhesive 50 is disposed at only one place. Specifically, the adhesive 50 is disposed in the region A (FIG. 5) surrounded by the fixing screws S1 in plan view. In particular, in the present embodiment, the adhesive 50 is disposed at the central portion of the region A in the longitudinal direction. In the present embodiment, as a representative specific example of the central portion of the region A in the longitudinal direction, FIG. 5 illustrates an intermediate position in the X-axis direction between two fixing screws S1 having a maximum pitch X1 therebetween. This position corresponds to the antinode of the amplitude of the vibration of the circuit board 30 in which the positions of the two fixing screws S1 with the interval of the maximum pitch X1 are used as nodes. Also in the lateral direction (Y-axis direction) of the region A, the adhesive 50 is laid out at an intermediate position between the two fixing screws S1 with the maximum pitch Y1. This position corresponds to the antinode of the amplitude of the vibration of the circuit board 30 in which the two fixing screws S1 with the interval of the maximum pitch Y1 are used as nodes.

Comparative Example

Figure 26:
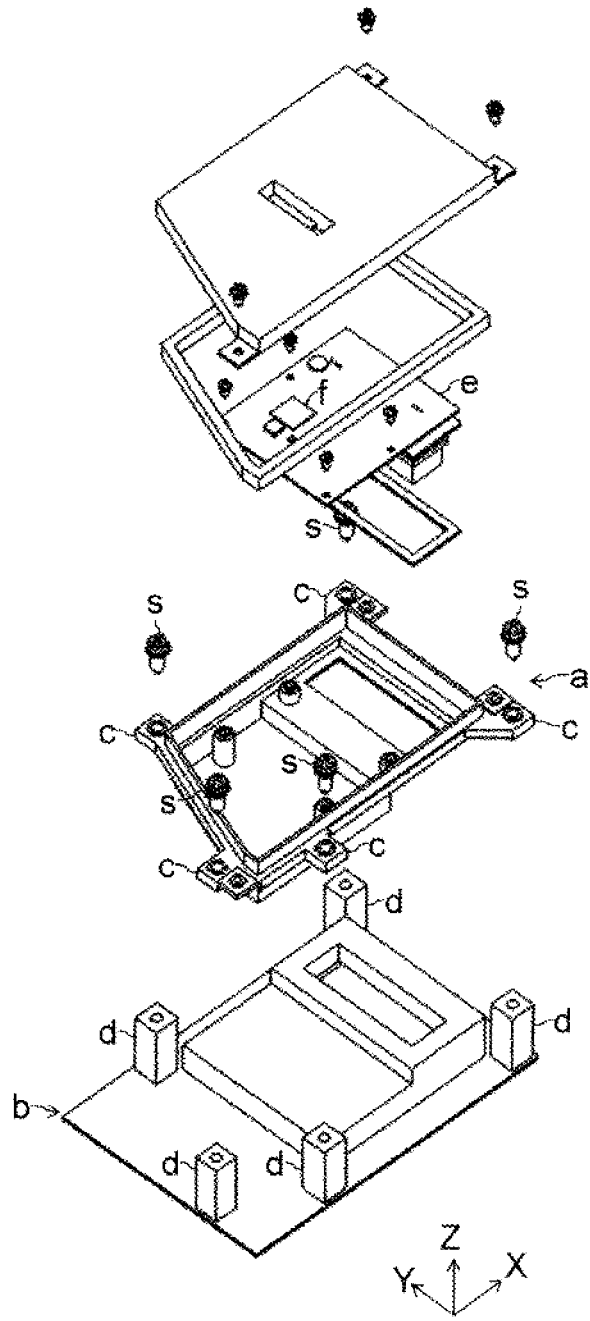
FIG. 26 is an exploded perspective view of an electronic control device according to a comparative example.

FIG. 26 is an exploded perspective view of an electronic control device according to a comparative example, and is a view corresponding to FIG. 4. The electronic control device illustrated in FIG. 26 is a virtual configuration example for comparison with the electronic control device 1 according to the first embodiment, and corresponds to a configuration in which the adhesive seat 18 (including the seat surface 19) and the adhesive 50 are omitted from the electronic control device 1.

When the electronic control device is attached to the in-vehicle device 100, large vibration may be received from the in-vehicle device 100. There is a possibility that, in order to prevent damage of a case a made of resin having lower rigidity than metal, vibration resistance is insufficient in fixing with five fixing screws s. If the number of fixing screws s for fixing the case a is increased, sufficient vibration resistance of the case a can be secured.

However, in consideration of a manufacturing error between a base b and the case a, it is not easy to manufacture the case a and the base 10 so that all five brackets c are uniformly seated on screw seats d when the case 20 is placed on the base 10. When the number of the fixing screws s is increased, the number of sets of the brackets c and the screw seats d is increased accordingly, and thus it becomes more difficult to manufacture the case a and the base b such that all the brackets c are uniformly seated on the screw seats d. When the bracket c and the screw seat d having a gap therebetween are fastened with the fixing screw s, the case a made of a resin is deformed, and accordingly, a circuit board e fixed to the case a is also distorted. As a result, stress is applied to the soldered portion between the circuit board e and an electronic component f mounted on the circuit board e, and the soldered portion is easily damaged due to a temperature change repeatedly caused by the operation of the in-vehicle device 100. Therefore, in consideration of a load applied to the soldered portion of the electronic component f, there is also a disadvantage in increasing the number of fixing screws s.

—Effects—

(1) According to the present embodiment, the case 20 holding the circuit board 30 is made of a resin. Thus, it is possible to prevent heat transfer from the in-vehicle device 100 to the circuit board 30 and to suppress heat transfer to the electronic component 40 mounted on the circuit board 30.

In addition, the case 20 and the base 10 are fixed by the plurality of fixing screws S1, and the case 20 and the base 10 are additionally fixed by the adhesive 50 at the position away from each fixing screw S1. As described above, by restraining the portion of the case 20 that is distant from the fixing screw S1 and is likely to vibrate with the adhesive 50 with respect to the base 10, it is possible to effectively damp the case 20 even with the same number of fixing screws S1 as in the comparative example of FIG. 26, and to improve the vibration resistance of the electronic control device 1.

In addition, since the thickness of the adhesive 50 before curing flexibly changes, even if the dimension (dimension in the Z-axis direction) of the gap g between the case 20 and the base 10 varies, it is possible to absorb the variation in the dimension of the gap g by the adhesive 50 at the time of assembling the electronic control device 1. Since the adhesive 50 is cured after the gap g is filled by changing the thickness in accordance with the manufacturing error between the case 20 and the base 10, it is possible to suppress the load applied to the soldered portion of the electronic component 40 in a static state without the case 20 deformed by being bonded to the base 10 with the adhesive 50.

As described above, according to the electronic control device 1 according to the present embodiment, it is possible to achieve both the vibration resistance and the life of the soldered portion of the electronic component 40. In addition, since it is possible to prevent the damage of the case 20, it is possible to secure high reliability of the electronic control device 1 even as an electromechanical integrated structure with the in-vehicle device 100.

As a result of analyzing the vibration resistance and the solder life of each of the electronic control devices according to the present embodiment and the comparative example by the inventors of the present application and the like, it has been confirmed that the electronic control device 1 according to the present embodiment has the improved vibration resistance without sacrificing the solder life as compared with the comparative example without the adhesive 50.

(2) Since it is possible to secure the desired vibration resistance while suppressing the number of the fixing screws S1, it is possible to suppress not only the number of the fixing screws but also the number of components required accompanying the fixing screws such as the insert collar, as compared with the case where the number of the fixing screws is increased to secure the vibration resistance. Since the number of components is reduced in this manner, it is also advantageous to improve ease of manufacturing. In addition, since the number of fixing screws S1 is suppressed, the manufacturing accuracy of the base 10 and the case 20 required at the time of assembly is relaxed, which is also an advantage related to the ease of manufacturing.

(3) In the present embodiment, by disposing the adhesive 50 in the region A surrounded by each fixing screw S1 in plan view, it is possible to secure an XY planar distance between each fixing screw S1 and the adhesive 50. As a result, it is possible to effectively obtain a damping effect by the adhesive 50. In particular, in the present embodiment, by disposing the adhesive 50 at the central portion of the region A in the longitudinal direction, it is possible to restrain the antinode of the amplitude that may occur in the case 20 in the absence of the adhesive 50, by the adhesive 50, and to efficiently obtain the damping effect. In the case of the present embodiment, since the adhesive 50 is located at the central portion of the region A in the lateral direction, it is possible to obtain the same effect for vibration control in the lateral direction.

(4) In addition, since the base 10 also serving as the cover that closes the opening 102 of the in-vehicle device 100 is included in the components of the electronic control device 1, the degree of freedom in designing the base 10 and the case 20 is increased as compared with the case where the case 20 is designed together with the ready-made opening cover of the in-vehicle device. As a result, it is also a great advantage in manufacturing the electronic control device 1 that it is possible to appropriately set the restraining portion between the base 10 and the case 20 by the adhesive 50.

(5) The electronic control device 1 has a novel structure in which the base 10 has the seat surface 19 in the region A, and the gap g interposed between the seat surface 19 and the case 20 is filled with the adhesive 50. Such a novel structure can also be easily manufactured by increasing the degree of freedom in designing the base 10 and the case 20.

(6) By sharing the adhesive 50 with other adhesives used for the seal members P2 and P3, it is possible to reduce the number of components of the electronic control device 1, which can contribute to improvement of ease of manufacturing and cost reduction. However, in order to obtain the above effect (1), the adhesive 50 may be different from other adhesives used for the seal members P2 and P3.

Second Embodiment

Figure 7:
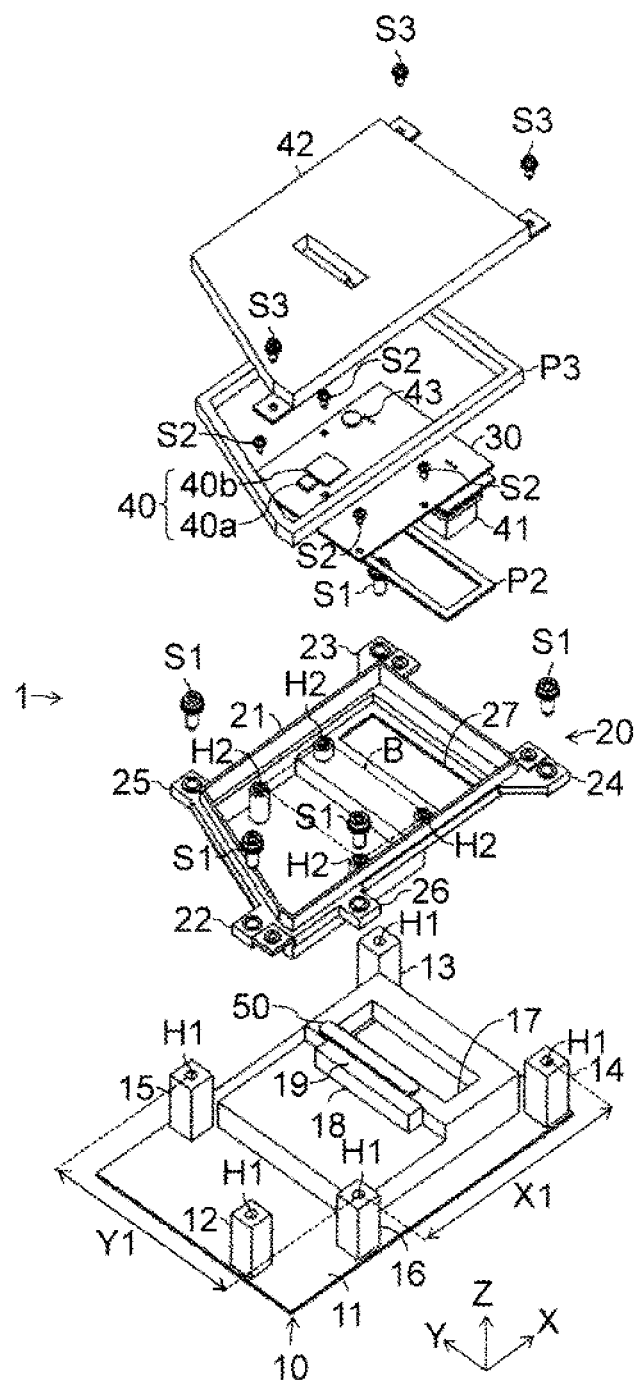
FIG. 7 is an exploded perspective view of an electronic control device according to a second embodiment of the present invention, which corresponds to FIG. 4 in the first embodiment.
Figure 8:
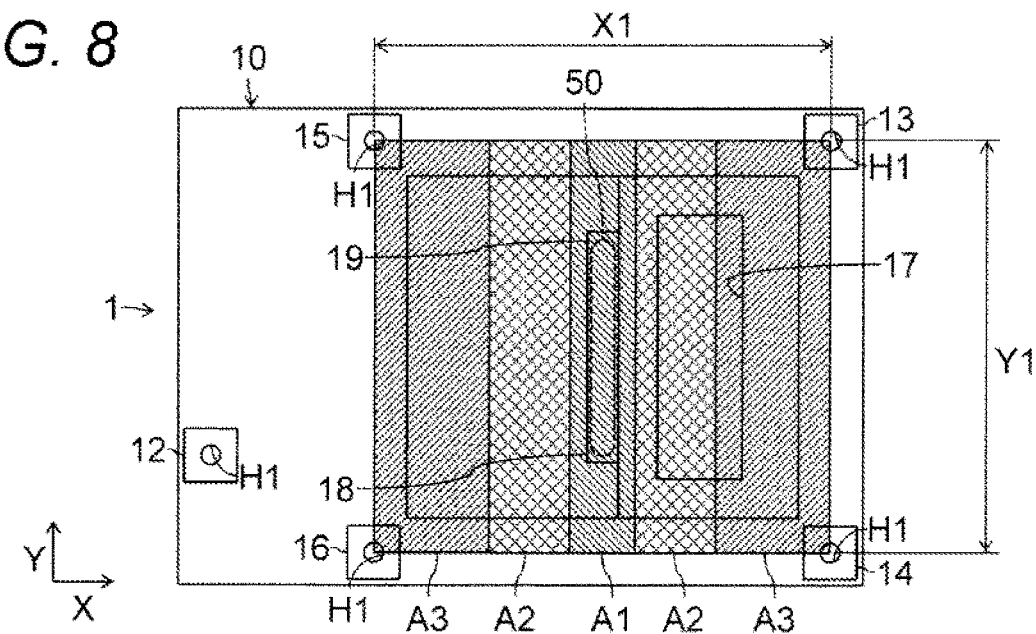
FIG. 8 is a plan view of a base included in the electronic control device according to the second embodiment of the present invention.

FIG. 7 is an exploded perspective view of an electronic control device according to a second embodiment of the present invention, and corresponds to FIG. 4 of the first embodiment. FIG. 8 is a plan view of a base included in the electronic control device illustrated in FIG. 7.

The present embodiment is different from the first embodiment in that the adhesive 50 extends linearly in the lateral direction (Y-axis direction) of the region A. Also in the present embodiment, a region A surrounded by the fixing screws S1 has a longitudinal direction (X-axis direction) and a lateral direction (Y-axis direction). Since the adhesive 50 is configured to extend in the lateral direction of the region A, the adhesive seat 18 also extends in the lateral direction (Y-axis direction) of the region A in accordance with the shape of the adhesive 50. In the present embodiment, the dimension of the adhesive 50 in the Y-axis direction is about half or slightly longer than the maximum pitch Y1 of the fixing screws S1 in the Y-axis direction, but can be set to be shorter than the maximum pitch Y1. The adhesive 50 extends in the lateral direction of the region A, but is located at the center of the region A in the same direction (the center position of the adhesive 50 is aligned with the center position of the region A in the lateral direction). The position of the adhesive 50 in the longitudinal direction of the region A is the same as that in the first embodiment, and also in the present embodiment, the adhesive 50 is located at the central portion of the region A in the longitudinal direction. The adhesive 50 is disposed only at this one place.

In the electronic control device 1 in the present embodiment, other components are similar to those of the electronic control device 1 of the first embodiment.

Also in the present embodiment, it is possible to obtain the same effects as those of the first embodiment by restraining the case 20 with respect to the base 10 with the adhesive 50 separately from the fixing screw S1.

In addition, when the adhesive 50 is omitted, as illustrated in FIG. 8, in a region A1 extending in a band shape in the Y-axis direction at the center in the X-axis direction in a region surrounded by four fixing screws S1 forming the maximum pitches X1 and Y1, the case 20 may swing most at the time of vibration application. This corresponds to an antinode of the amplitude in the X-axis direction. On the other hand, two regions A3 extending in a band shape in the Y-axis direction at both ends in the X-axis direction are close to nodes of the amplitude, and deflection of the case 20 is small. In the band-shaped region A2 between the regions A1 and A3, the magnitude of the deflection of the case 20 is about the middle. In the present embodiment, since the adhesive 50 extends along the band-shaped region A1 that may swing the most, it is possible to restrain the region A1 of the case 20 in a wider range than in the first embodiment. According to the analysis by the inventors of the present application, in the present embodiment, high vibration resistance was confirmed as compared with the first embodiment.

When the adhesive 50 is extended in the longitudinal direction of the region A even in the same linear shape, the effect is not significantly improved as compared with the first embodiment, and the superiority of the configuration in which the adhesive 50 is extended in the lateral direction of the region A is confirmed.

Third Embodiment

The present embodiment is different from the first embodiment in that the Young modulus of the adhesive 50 is 1 MPa or more. The Young modulus referred to herein is the Young modulus of the adhesive 50 after curing. Other components are the same as those of the first embodiment.

Figure 9:
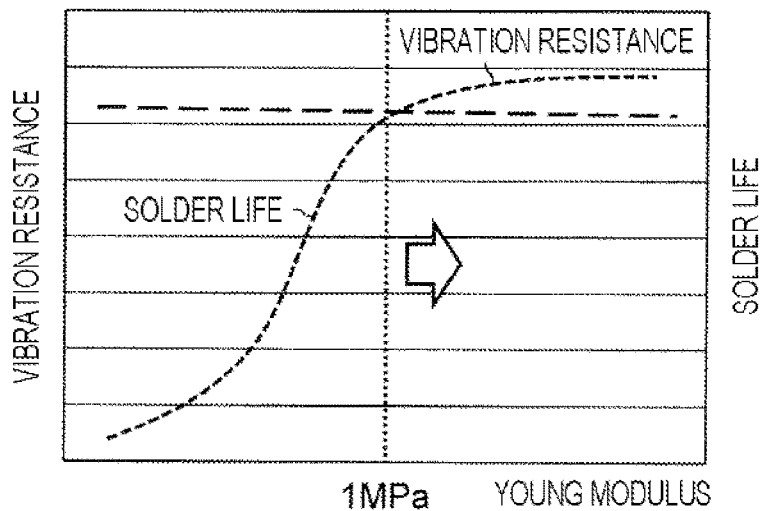
FIG. 9 is a graph illustrating a relationship between a Young modulus of an adhesive, and vibration resistance and a solder life used in an electronic control device according to a third embodiment of the present invention.

FIG. 9 is a graph illustrating a relationship between the Young modulus of the adhesive, and vibration resistance and a solder life used in an electronic control device according to a third embodiment of the present invention. As an example, the vibration resistance can be evaluated by the maximum vibration acceleration G at which the electronic control device 1 may normally operate when the electronic control device 1 is vibrated. As an example, the solder life can be evaluated by the number of repetitions N until the soldered portion of the electronic component 40 is damaged after the electronic control device 1 is mounted on the in-vehicle device 100 by using the number of repetitions N of the assumed temperature change to which the electronic control device 1 is exposed with the operation of the in-vehicle device 100 as a parameter.

When the present inventors analyzed the vibration resistance and the solder life by using the Young modulus of the adhesive 50 as the parameter, the vibration resistance was improved as the Young modulus of the adhesive 50 increased. However, when the Young modulus was 1 MPa or more, the rate of improvement in vibration resistance accompanying the increase in Young modulus of the adhesive 50 slowed down.

Regarding the solder life, there was no noticeable change even when the Young modulus of the adhesive 50 changed, and it was confirmed that the same solder life as that of the first embodiment could be secured even when the Young modulus was set to 1 MPa or more.

From the above description, by setting the Young modulus of the adhesive 50 to 1 MPa or more, it is possible to effectively derive the vibration resistance performance of the electronic control device 1 without sacrificing the solder life in the present structure, and to achieve both the high level of the vibration resistance and the solder life.

In the present embodiment, the example in which the Young modulus of the adhesive 50 is set to 1 MPa or more has been described in the configuration of the first embodiment, but it is effective to set the Young modulus of the adhesive 50 to 1 MPa or more also in the second embodiment and each embodiment to be described later.

Fourth Embodiment

Figure 10:
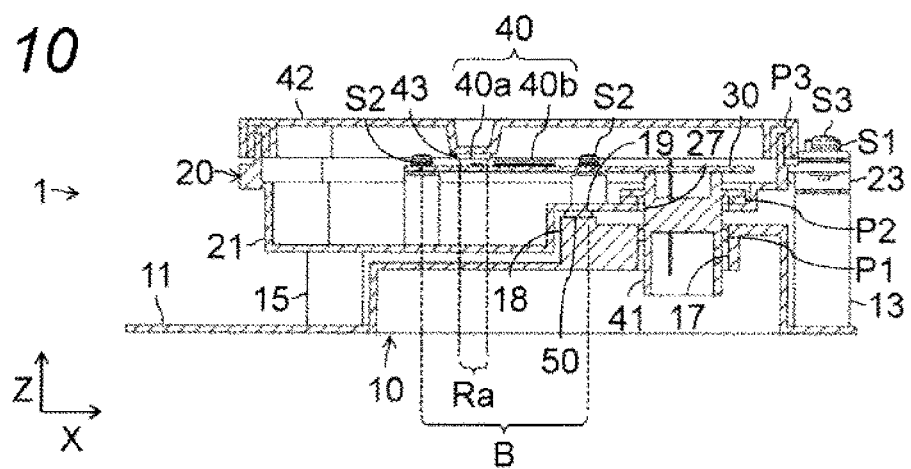
FIG. 10 is a cross-sectional view of an electronic control device according to a fourth embodiment of the present invention, which corresponds to FIG. 6 in the first embodiment.

FIG. 10 is a cross-sectional view of an electronic control device according to a fourth embodiment of the present invention, and corresponds to FIG. 6 in the first embodiment.

The present embodiment is different from the first embodiment in that the adhesive 50 is disposed so as not to overlap at least the QFN package 40*a* of the electronic component 40 in plan view. That is, the entirety of the QFN package 40*a* and the entirety of the adhesive 50 do not overlap each other in the Z-axis direction, and the layout of the adhesive 50 is completely shifted in an XY plane direction with respect to a vertical region Ra of the QFN package 40*a*.

In the case of the present embodiment, since the base 10 and the case 20 are connected via the adhesive 50, it is conceivable that the adhesive 50 expands due to heat transfer from the base 10 and a load is applied to the case 20. In this case, even in the case of an electronic component, for example, in the case of a quad flat package (QFP), even when a load is applied to the soldered portion via the case 20 and the circuit board 30, the deformation may be absorbed to some extent by a lead wire exposed to the outer peripheral portion. On the other hand, since the QFN package 40*a* has a structure in which an electrode pad is provided on the surface, and the lead wire does not come out, an allowance for deformation is small as compared with the QFP or the like, and the soldered portion thereof is weak against a load.

Therefore, in the present embodiment, the entirety of the QFN package 40*a* and the entirety of the adhesive 50 are set not to overlap each other in the Z-axis direction, and thus a distance from the adhesive 50 to the QFN package 40*a* on the case 20 and the circuit board 30 is secured. As a result, even though the adhesive 50 expands, it is possible to suppress deformation transmitted to the QFN package 40*a* via the case 20 and the circuit board 30 and to effectively protect the QFN package 40*a*.

In the second embodiment, the third embodiment, and each embodiment to be described later, the configuration in which the positions of the adhesive 50 and the QFN package 40*a* are shifted from each other is also effective. On the other hand, in the first embodiment, the positions of the adhesive 50 and the QFN package 40*a* are shifted similarly to the present embodiment, but, as long as the above-described essential effect (1) is obtained, in the first embodiment, a portion or the entirety of the adhesive 50 may vertically overlap the QFN package 40*a*.

Fifth Embodiment

Figure 11:
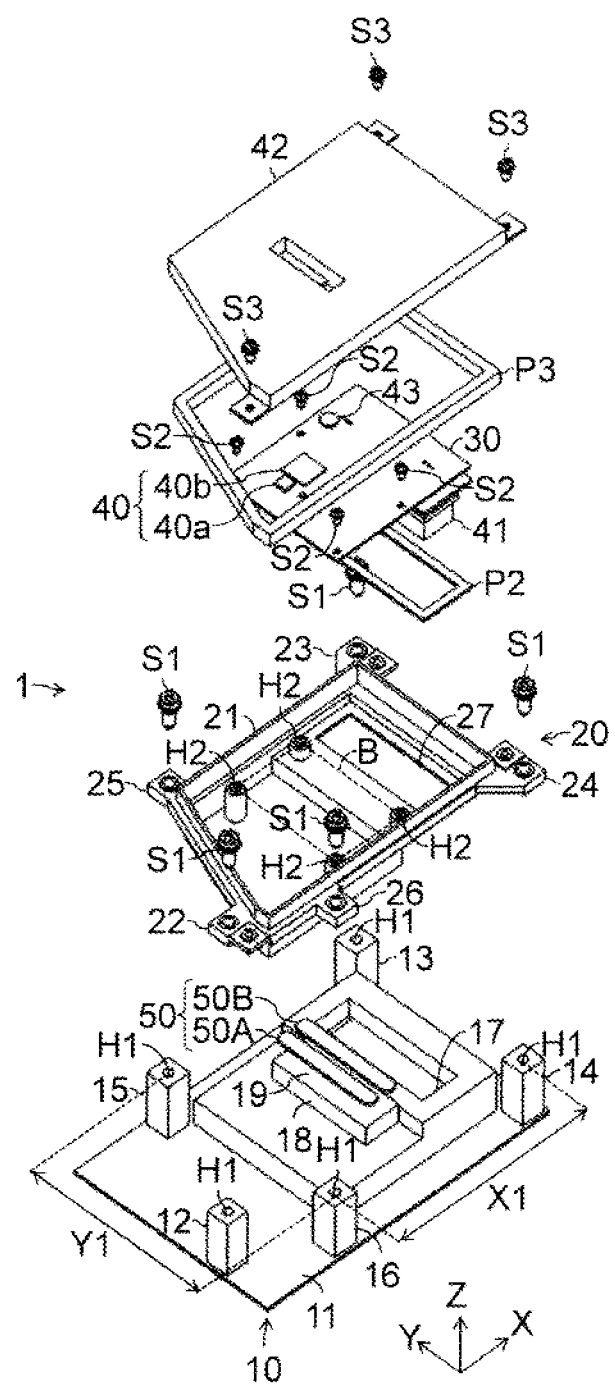
FIG. 11 is an exploded perspective view of an electronic control device according to a fifth embodiment of the present invention, which corresponds to FIG. 4 in the first embodiment.

FIG. 11 is an exploded perspective view of an electronic control device according to a fifth embodiment of the present invention, and corresponds to FIG. 4 of the first embodiment.

The present embodiment is different from the second embodiment in that a plurality of adhesives 50 are arranged in the longitudinal direction of the region A (FIG. 5). FIG. 11 illustrates a configuration in which two adhesives 50A and 50B extending linearly in the Y-axis direction are arranged in the X-axis direction, but three or more adhesives may be arranged. For example, the position of any one of the adhesives 50A and 50B in FIG. 11 or the position between the adhesives 50A and 50B corresponds to the position of the adhesive 50 in the second embodiment (FIG. 7).

In the electronic control device 1 in the present embodiment, other components are similar to those of the electronic control device 1 of the second embodiment.

According to the present embodiment, the plurality of adhesives 50 increases the binding force of the case 20 to the base 10 as compared with the second embodiment, and the vibration resistance of the electronic control device 1 is further improved.

In the present embodiment, the example in which the plurality of adhesives 50 is provided in the longitudinal direction of the region A in the configuration of the second embodiment has been described, but it is effective to provide the plurality of adhesives 50 in the longitudinal direction of the region A also in the first embodiment, the third embodiment, the fourth embodiment, and each embodiment described later.

Sixth Embodiment

Figure 12:
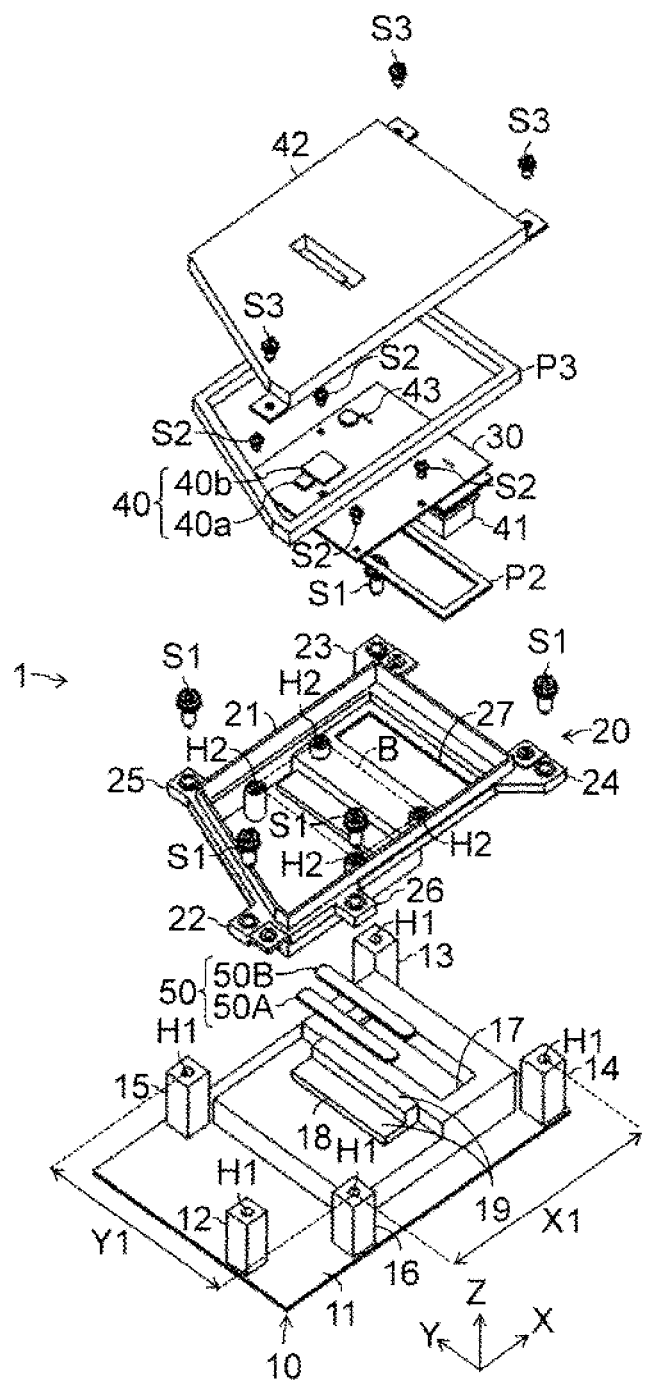
FIG. 12 is an exploded perspective view of an electronic control device according to a sixth embodiment of the present invention, which corresponds to FIG. 4 in the first embodiment.
Figure 13:
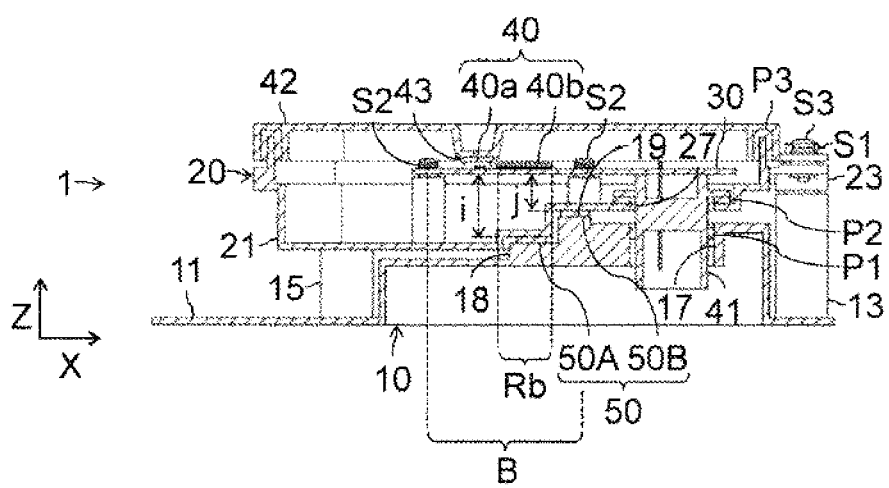
FIG. 13 is a cross-sectional view of the electronic control device according to the sixth embodiment of the present invention, which corresponds to FIG. 6 in the first embodiment.

FIG. 12 is an exploded perspective view of an electronic control device according to a sixth embodiment of the present invention, and corresponds to FIG. 4 of the first embodiment. FIG. 13 is a cross-sectional view of an electronic control device according to the sixth embodiment of the present invention, and corresponds to FIG. 6 in the first embodiment.

In the present embodiment, distances between a plurality of adhesives 50A and 50B arranged in the longitudinal direction of the region A and the circuit board 30 are different. Among the adhesives 50A and 50B, the adhesive overlapping the BGA package 40*b* in plan view (in this example, the adhesive 50A in a vertical region Rb of the BGA package 40b) is farther from the circuit board 30 than the other adhesives (in this example, the adhesive 50B). In the present embodiment, as illustrated in FIG. 12, the adhesive seat 18 has a stepwise shape, and the adhesives 50A and 50B are disposed stepwise. The adhesive 50A overlaps the BGA package 40b in plan view, and a distance i between the adhesive 50A and the circuit board 30 is longer than a distance j between the adhesive 50B and the circuit board 30.

Other components of the electronic control device 1 in the present embodiment are similar to those of the electronic control device 1 in the fifth embodiment (FIG. 11).

Since the terminals of the BGA package 40b are hemispherically arranged in a lattice pattern on the bottom surface, an allowance for deformation is small as compared with the QFP and the like although the BGA package 40b is not as small as the QFN package 40a, and the soldered portion thereof is weak against a load.

Therefore, in the present embodiment, an adhesive 50a vertically overlapping the BGA package 40b is far from the circuit board 30 more than the other adhesives 50b, and the distance from the adhesive 50 to the BGA package 40b on the case 20 and the circuit board 30 is secured. As a result, even though the adhesive 50 expands, it is possible to suppress deformation transmitted to the BGA package 40b via the case 20 and the circuit board 30 and to effectively protect the BGA package 40b.

Instead of the configuration in which the adhesives 50A and 50B extend in the lateral direction of the region A as in the present embodiment, for example, as in the first embodiment and the third embodiment, the shapes of the adhesives 50A and 50B may be dotted. The present embodiment is also suitably combined with the fourth embodiment (FIG. 10). In addition, a configuration in which a plurality of adhesives 50 is provided in a stepwise manner in the longitudinal direction of the region A and the BGA package 40b overlaps the adhesive 50 far from the circuit board 30 is also effective to be applied to each embodiment described later.

Seventh Embodiment

Figure 14:
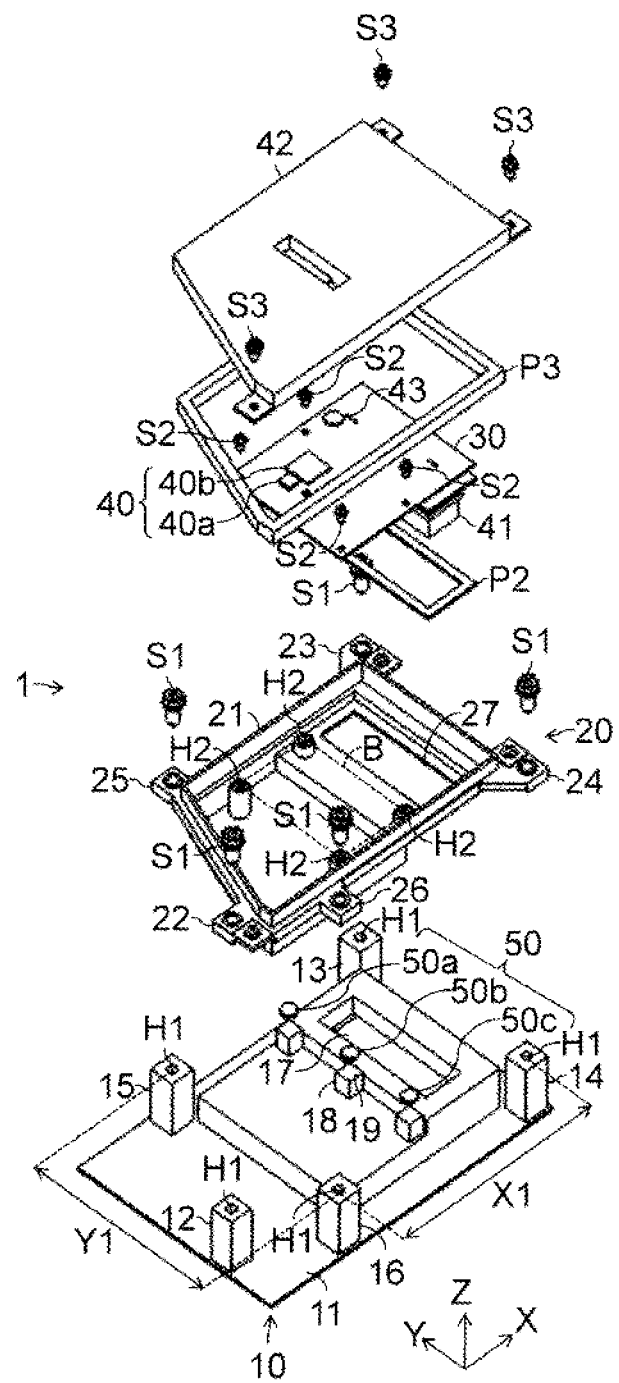
FIG. 14 is an exploded perspective view of an electronic control device according to a seventh embodiment of the present invention, which corresponds to FIG. 4 in the first embodiment.

FIG. 14 is an exploded perspective view of an electronic control device according to a seventh embodiment of the present invention, and corresponds to FIG. 4 of the first embodiment.

The present embodiment is different from the first embodiment in that a plurality of adhesives 50 are arranged in the lateral direction of the region A (FIG. 5). In the present embodiment, as illustrated in FIG. 14, a plurality (three) of the adhesive seats 18 are disposed in the lateral direction of the region A, and the seat surfaces 19 of all the adhesive seats 18 have an equal distance from the case 20. A dotted adhesive is applied onto the seat surface 19 of each adhesive seat 18. FIG. 14 illustrates a configuration in which three dotted adhesives 50a to 50c are arranged in the Y-axis direction, but two or four or more adhesives may be arranged. For example, the position of the adhesive 50b in the center of FIG. 14 corresponds to the position of the adhesive 50 in the first embodiment (FIG. 4).

In the electronic control device 1 in the present embodiment, other components are similar to those of the electronic control device 1 of the first embodiment.

According to the present embodiment, by disposing the adhesives 50 at a plurality of places in the lateral direction of the region A, as a result of analysis, the vibration resistance and the solder life that are substantially the same as those of the second embodiment were confirmed. In addition, since the existence range of the adhesive 50 is intermittent in the Y-axis direction as compared with the second embodiment, the influence of expansion of the adhesive 50 on the case 20 is also suppressed as compared with the second embodiment.

Eighth Embodiment

Figure 15:
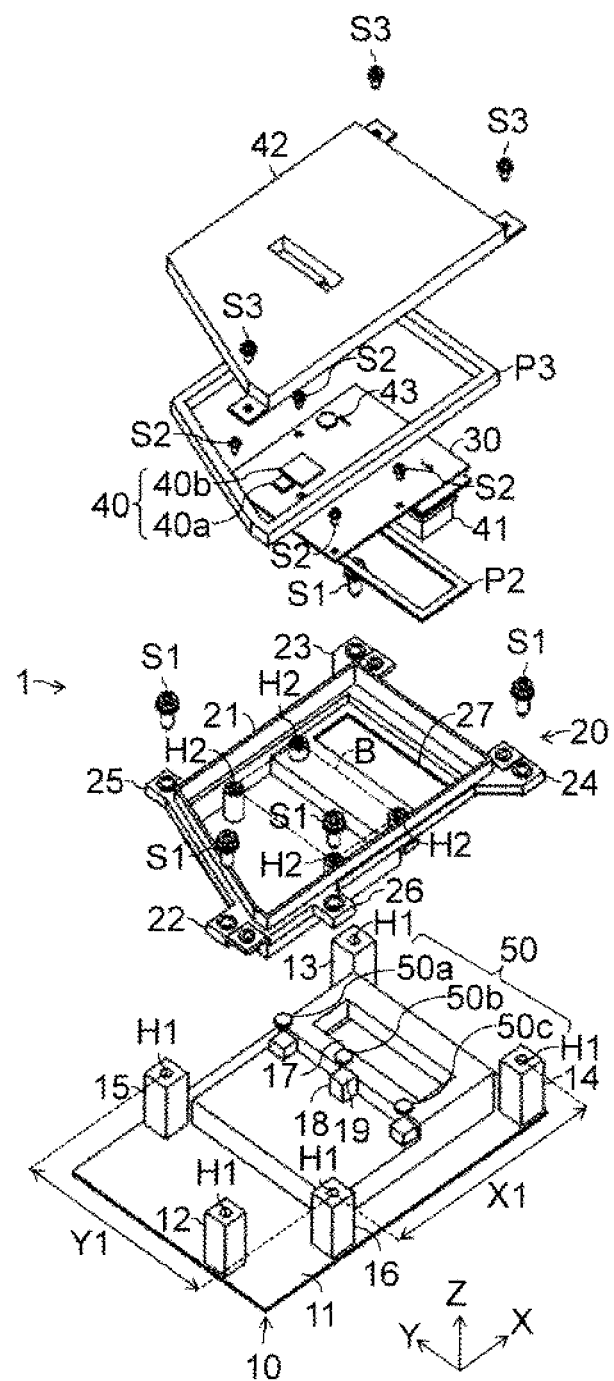
FIG. 15 is an exploded perspective view of an electronic control device according to an eighth embodiment of the present invention, which corresponds to FIG. 4 in the first embodiment.
Figure 16:
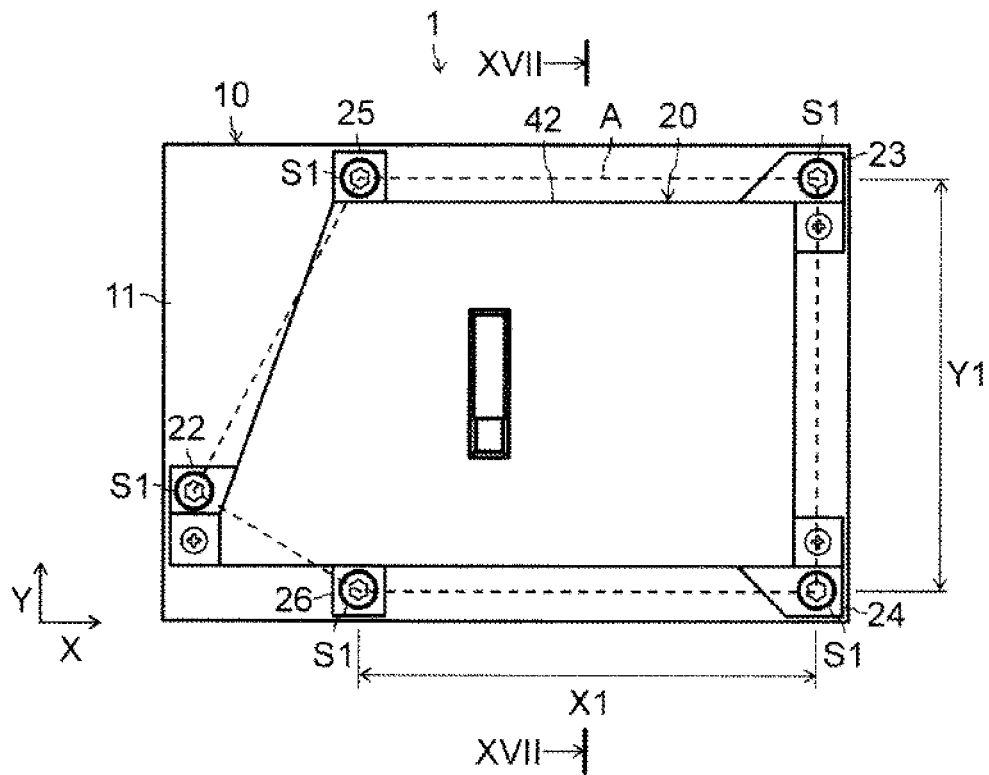
FIG. 16 is a plan view of the electronic control device according to the eighth embodiment of the present invention, which corresponds to FIG. 5 in the first embodiment.
Figure 17:
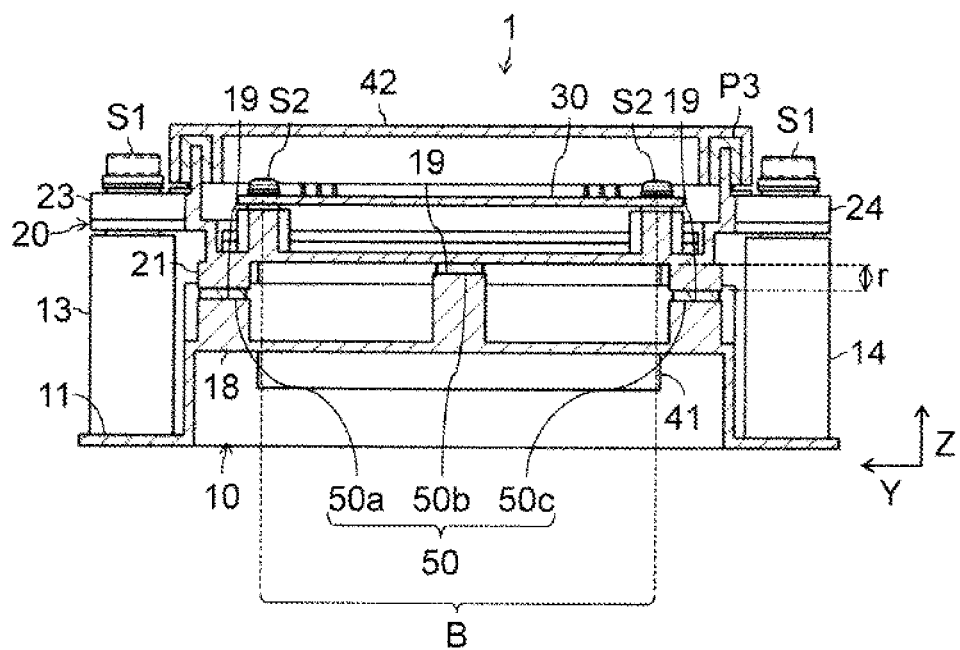
FIG. 17 is a cross-sectional view of the electronic control device taken along line XVII-XVII in FIG. 16.

FIG. 15 is an exploded perspective view of an electronic control device according to an eighth embodiment of the present invention, and corresponds to FIG. 4 of the first embodiment. FIG. 16 is a plan view of the electronic control device according to the eighth embodiment of the present invention, and corresponds to FIG. 5 in the first embodiment. FIG. 17 is a cross-sectional view of the electronic control device taken along line XVII-XVII in FIG. 16.

The present embodiment is based on the configuration of the seventh embodiment in which the plurality of adhesives 50 is disposed in the lateral direction of the region A. In the present embodiment, one (the case 20 in this example) of the base 10 and the case 20 is a resin component, and the other (the base 10 in this example) is a metal component. The adhesive (the adhesive 50b at the center) located on an inner side in the lateral direction (Y-axis direction) of the region A is located closer to the resin component (upper side in the Z-axis direction) than the adhesive (the adhesives 50a and 50c at both ends) located on the outer side in the lateral direction. In the present embodiment, as illustrated in FIG. 15, a plurality (three) of adhesive seats 18 are disposed in the lateral direction of the region A. As illustrated in FIG. 17, the seat surface 19 of the adhesive seat 18 at the center is located above the seat surfaces 19 of the adhesive seats 18 at both ends in the Z-axis direction by a dimension r, and the adhesive 50b at the center is closer to the circuit board 30 by the dimension r than the adhesives 50a and 50c at both ends. The adhesive 50b is located at the center of the maximum pitch X1 of the fixing screws S1 in the longitudinal direction of the region A, and is located at the center of the maximum pitch Y1 of the fixing screws S1 in the lateral direction of the region A.

Other components of the electronic control device 1 in the present embodiment are similar to those of the electronic control device 1 in the fifth embodiment (FIG. 11).

Vibration in which nodes and antinodes of vibration are aligned mainly in the longitudinal direction of the region A occurs in the case 20, but vibration in which nodes and antinodes of vibration are aligned in the lateral direction of the region A may also occur in combination. The latter vibration becomes the maximum (the antinode of the amplitude) at the center of the maximum pitch Y1 of the fixing screws S1 in the lateral direction. In the present embodiment, the base 10 and the case 20 are bonded by the adhesive 50b at this position.

When the ratios of the metal and the resin at the respective bonding places of the adhesives 50a to 50c in the Y-axis direction are compared with each other, regarding the ratio of the metal as the material of the base 10, the central bonding place by the adhesive 50b is greater than the bonding places by the other adhesives 50a and 50c (FIG. 17). In other words, regarding the ratio of the resin as the material of the case 20, the bonding places at both ends by the adhesives 50a and 50c are greater than the bonding place by the adhesive 50b. With this configuration, it is possible to rigidly restrain the central portion in the lateral direction of the case 20 having a large amplitude, by increasing the ratio of the metal in the support structure. On the other hand, in the outer portion in the lateral direction having a small amplitude, it is possible to suppress the transmission of stress generated by the expansion of the adhesives 50a and 50c to the circuit board 30 by a flexible resin. As a result, it is possible to set the balance between the vibration resistance and the solder life of the electronic control device 1 to be more favorable.

As a result of analysis by the inventors of the present application and the like, when the ratio of the metal material in all the three bonding places by the adhesives 50a to 50c is uniformly increased, the vibration resistance is improved, but the solder life is reduced. On the other hand, when the ratio of the resin material in all of the three bonding places is uniformly increased, the solder life is extended, but the vibration resistance is reduced. In contrast to the example of FIG. 17, when the ratio of the resin material at the central bonding place is relatively increased and the ratio of the metal material at the bonding places at both ends is relatively increased, the effect is reduced in both the vibration resistance and the solder life. From such results, focusing on the vibration in the lateral direction, the configuration in which the ratio of the metal material is relatively large at the central bonding place and the ratio of the resin material is relatively large at the bonding places at both ends is preferable as in the present embodiment.

Ninth Embodiment

Figure 18:
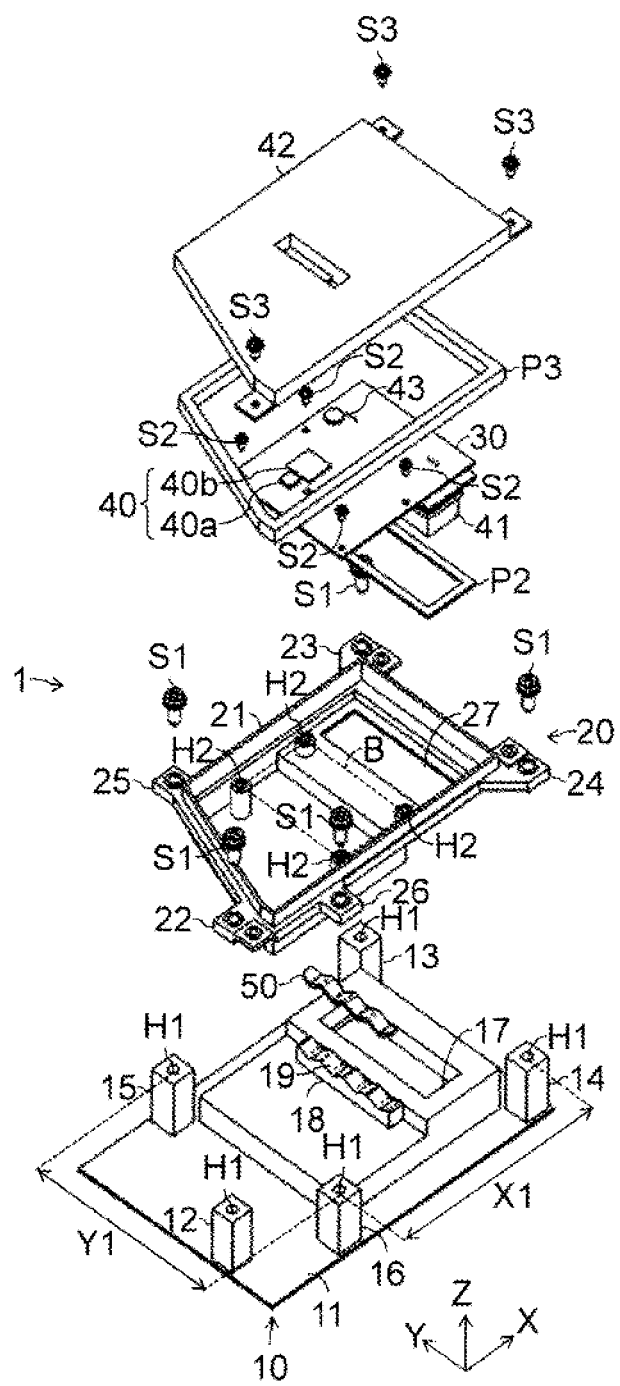
FIG. 18 is an exploded perspective view of an electronic control device according to a ninth embodiment of the present invention, which corresponds to FIG. 4 in the first embodiment.
Figure 19:
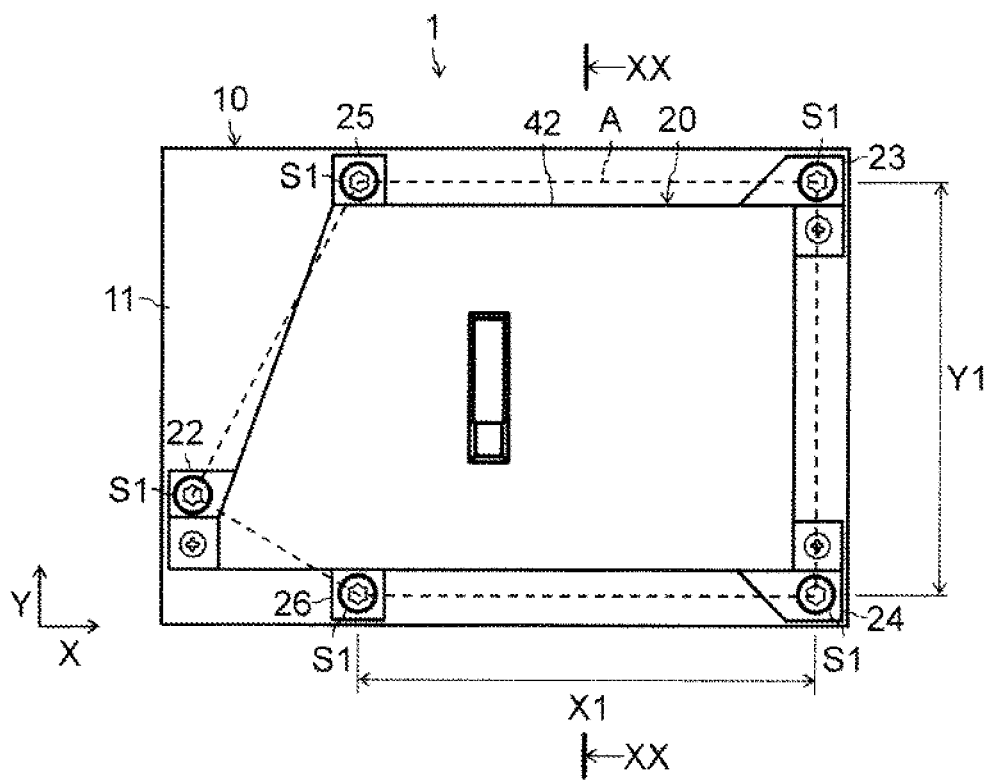
FIG. 19 is a plan view of the electronic control device according to the ninth embodiment of the present invention, which corresponds to FIG. 5 in the first embodiment.
Figure 20:
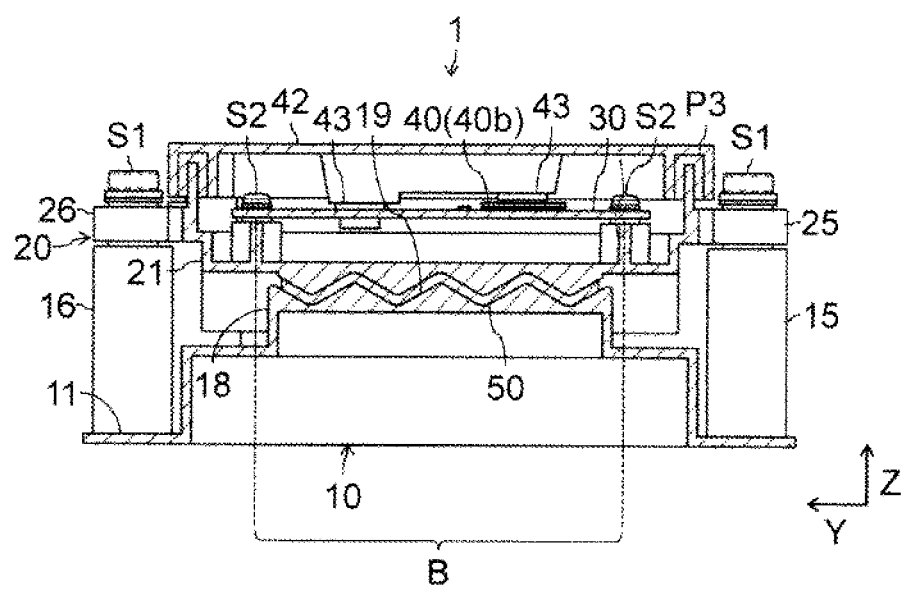
FIG. 20 is a cross-sectional view of the electronic control device taken along line XX-XX in FIG. 19.

FIG. 18 is an exploded perspective view of an electronic control device according to a ninth embodiment of the present invention, and corresponds to FIG. 4 of the first embodiment. FIG. 19 is a plan view of the electronic control device according to the ninth embodiment of the present invention, and corresponds to FIG. 5 in the first embodiment. FIG. 20 is a cross-sectional view of the electronic control device taken along line XX-XX in FIG. 19.

The present embodiment is based on the configuration of the second embodiment in which the adhesive 50 is linearly extended in the lateral direction of the region A. The present embodiment is different from the second embodiment in that the adhesive 50 is configured to have a wave shape as viewed in the longitudinal direction of the region A (as viewed in the cross section of FIG. 20). In the case of the present embodiment, the seat surface 19 of the adhesive seat 18 has a shape in which a smooth inclined surface inclined upward toward one side in the lateral direction of the region A and a smooth inclined surface inclined downward are alternately joined in the lateral direction of the region A. It is desirable that the areas of the upward inclined surface and the downward inclined surface are substantially the same, and the total area of the upward inclined surface and the total area of the downward inclined surface are substantially the same. As illustrated in FIG. 20, when viewed from the longitudinal direction of the region A, the seat surface 19 has a polygonal line-shaped wave shape. The surface of the case 20 facing the seat surface 19 is also formed in a wave shape corresponding to the seat surface 19. As a result, the adhesive 50 extending linearly in the lateral direction of the region A is also interposed between the seat surface 19 and the case 20 and formed in a wave shape.

The seat surface 19 may be formed to have a curved wave shape when viewed from the longitudinal direction of the region A.

Other components of the electronic control device 1 in the present embodiment are similar to those of the electronic control device 1 in the second embodiment (FIG. 7).

In the case of the present embodiment, stress acting in the normal direction of the seat surface 19 along with the expansion of the adhesive 50 has a Y-axis direction component and a Z-axis direction component due to the inclination of the seat surface 19. The Y-axis direction components cancel each other because the vectors of the stress generated on the upward inclined surface and the stress generated on the downward inclined surface are opposite to each other. Therefore, the stress transmitted to the case 20 by the expansion of the adhesive 50 becomes only the Z-axis direction component and decreases by the Y-axis direction component. By suppressing the stress transmitted to the case 20 in this manner, according to the present embodiment, it is possible to expect further improvement in vibration resistance and solder life. Also in the analysis, more favorable results were confirmed in both the vibration resistance and the solder life.

Tenth Embodiment

Figure 21:
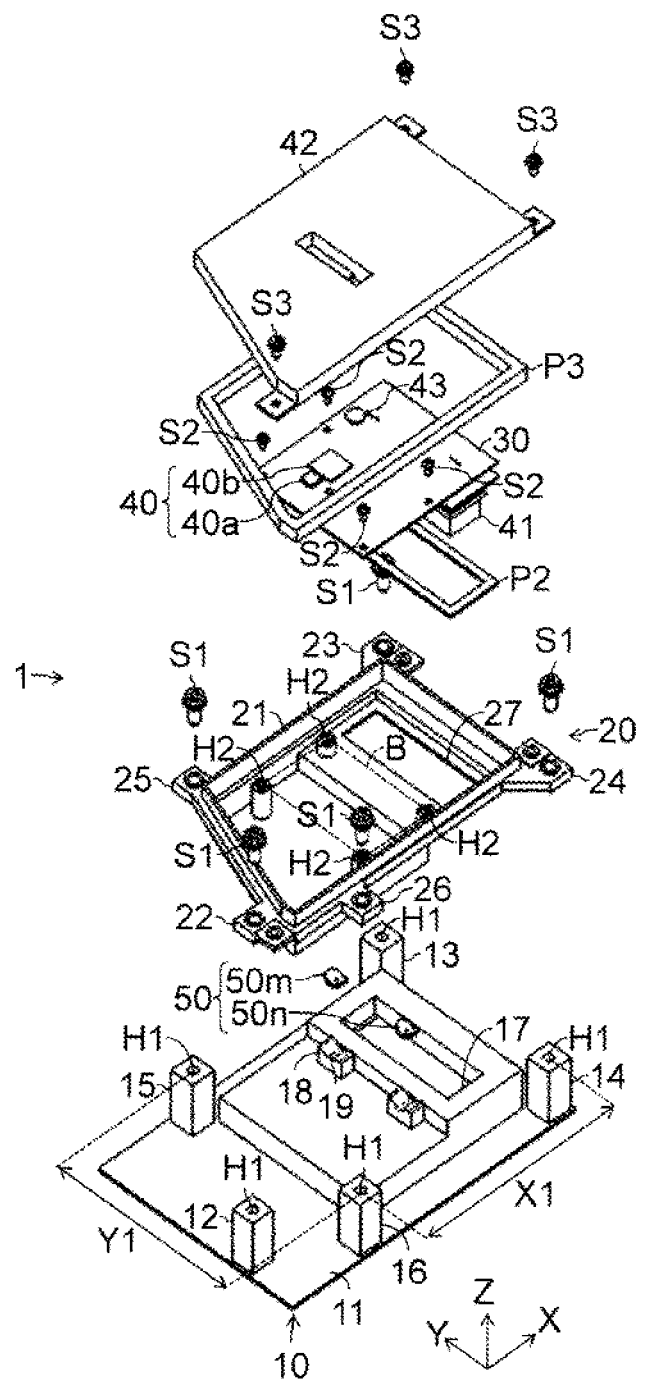
FIG. 21 is an exploded perspective view of an electronic control device according to a tenth embodiment of the present invention, which corresponds to FIG. 4 in the first embodiment.
Figure 22:
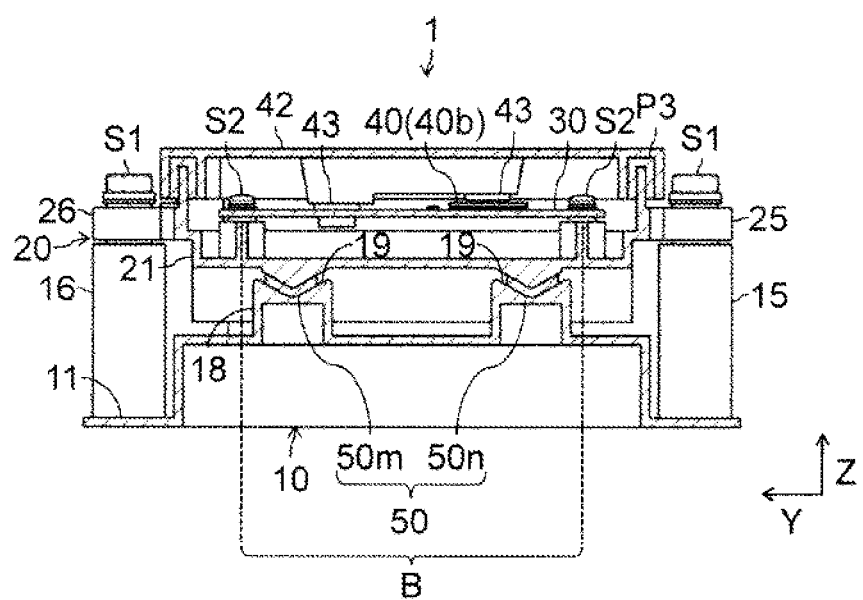
FIG. 22 is a cross-sectional view of the electronic control device according to the tenth embodiment of the present invention, which corresponds to FIG. 20 in the ninth embodiment.

FIG. 21 is an exploded perspective view of an electronic control device according to a tenth embodiment of the present invention, and corresponds to FIG. 4 of the first embodiment. FIG. 22 is a cross-sectional view of the electronic control device according to the tenth embodiment of the present invention, and corresponds to FIG. 20 in the ninth embodiment.

In the embodiment of the present embodiment, as in the seventh embodiment (FIG. 14), a plurality of the adhesives 50 (adhesives 50m and 50n) are arranged in the lateral direction of the region A (FIG. 5). The adhesives 50m and 50n are configured to have a wave shape as in the ninth embodiment (FIG. 22) when viewed in the longitudinal direction of the region A (when viewed in the cross section of FIG. 20). In other words, the present embodiment corresponds to a configuration in which the adhesive 50 in the ninth embodiment is intermittently thinned out in the lateral direction of the region A. However, the upward inclined surface and the downward inclined surface need to exist to the same extent. The present embodiment is similar to the ninth embodiment except for this point.

Also in the present embodiment, it is possible to obtain the effects similar to those of the ninth embodiment. In addition, since the volume of the adhesive 50 is relatively small, it is possible to suppress the stress itself generated by the expansion of the adhesive 50 as compared with the ninth embodiment.

Eleventh Embodiment

Figure 23:
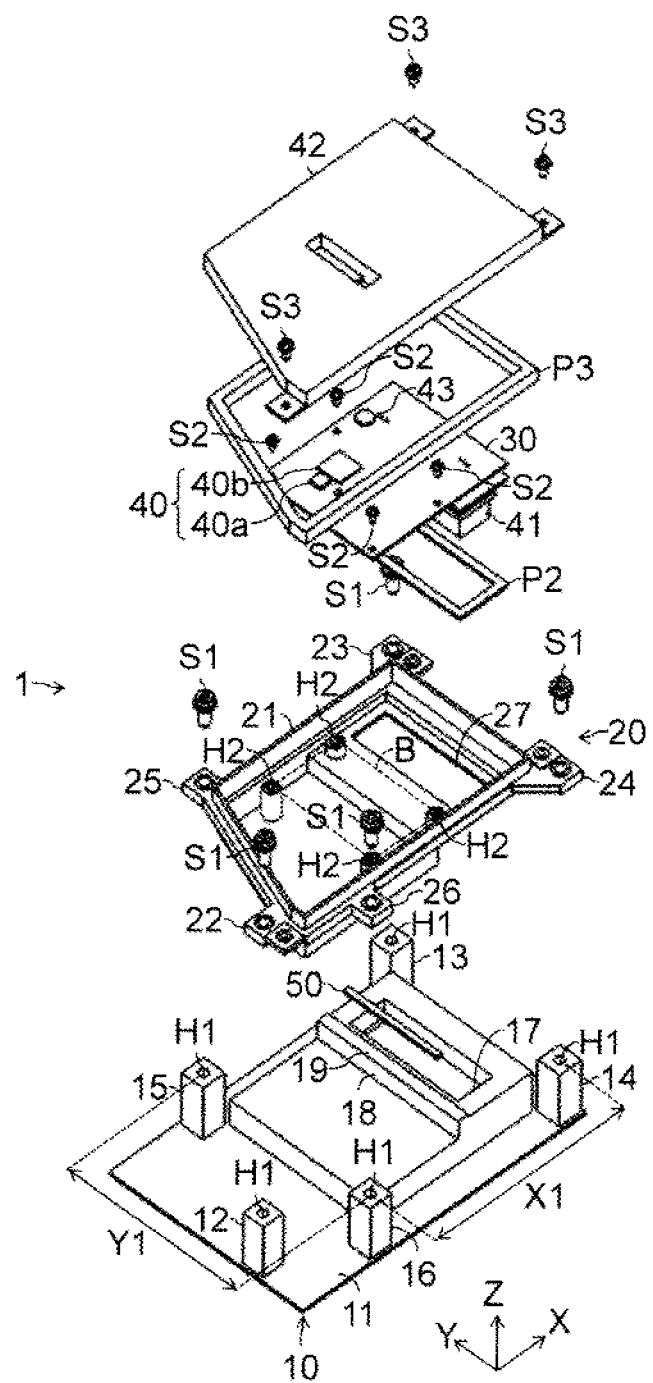
FIG. 23 is an exploded perspective view of an electronic control device according to an eleventh embodiment of the present invention, which corresponds to FIG. 4 in the first embodiment.
Figure 24:
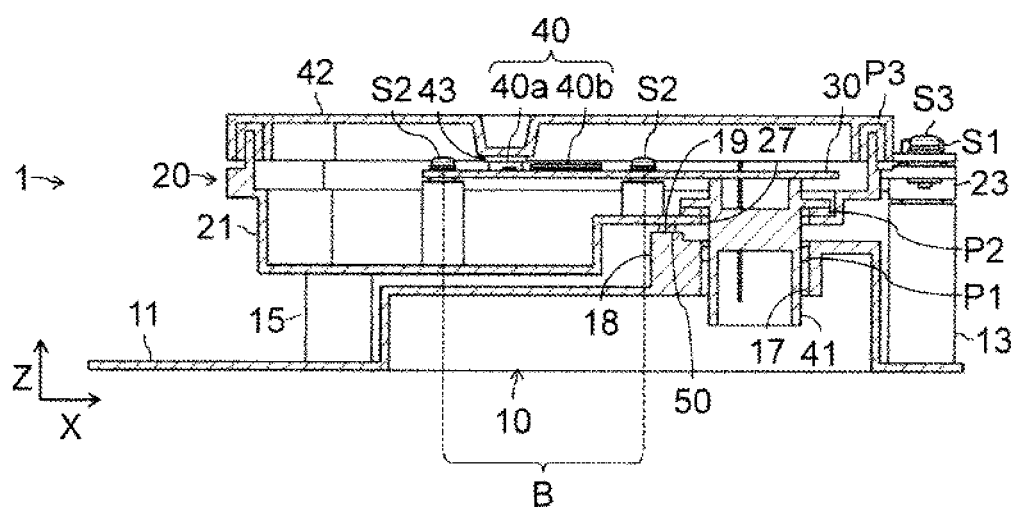
FIG. 24 is a cross-sectional view of the electronic control device according to the eleventh embodiment of the present invention, which corresponds to FIG. 6 in the first embodiment.

FIG. 23 is an exploded perspective view of an electronic control device according to an eleventh embodiment of the present invention, and corresponds to FIG. 4 of the first embodiment. FIG. 24 is a cross-sectional view of the electronic control device according to the eleventh embodiment of the present invention, and corresponds to FIG. 6 in the first embodiment.

As described in the first embodiment, the circuit board 30 is fixed to the case 20 with the plurality of (four in the example) board screws S2. In the present embodiment, the adhesive 50 is disposed so as not to overlap the region B surrounded by the board screws S2 in plan view. The adhesive 50 is located between the region B and the connector 41, and the entirety of the adhesive 50 is deviated from the region B in the X-axis direction (that is, the longitudinal direction of the region A).

As a result, even when the adhesive 50 is expanded, it is possible to suppress transmission of the stress generated by the expansion to the electronic component 40 disposed in the region B via the case 20 and the circuit board 30, and to effectively protect the electronic component 40.

The configuration in which the positions of the adhesive 50 and the region B are shifted is also effective in the second to tenth embodiments and embodiments to be described later. On the other hand, in the first embodiment, the positions of the adhesive 50 and the region B are shifted similarly to the present embodiment, but as long as the above-described essential effect (1) is obtained, in the first embodiment, a portion or the entirety of the adhesive 50 may vertically overlap the region B.

Twelfth Embodiment

Figure 25:
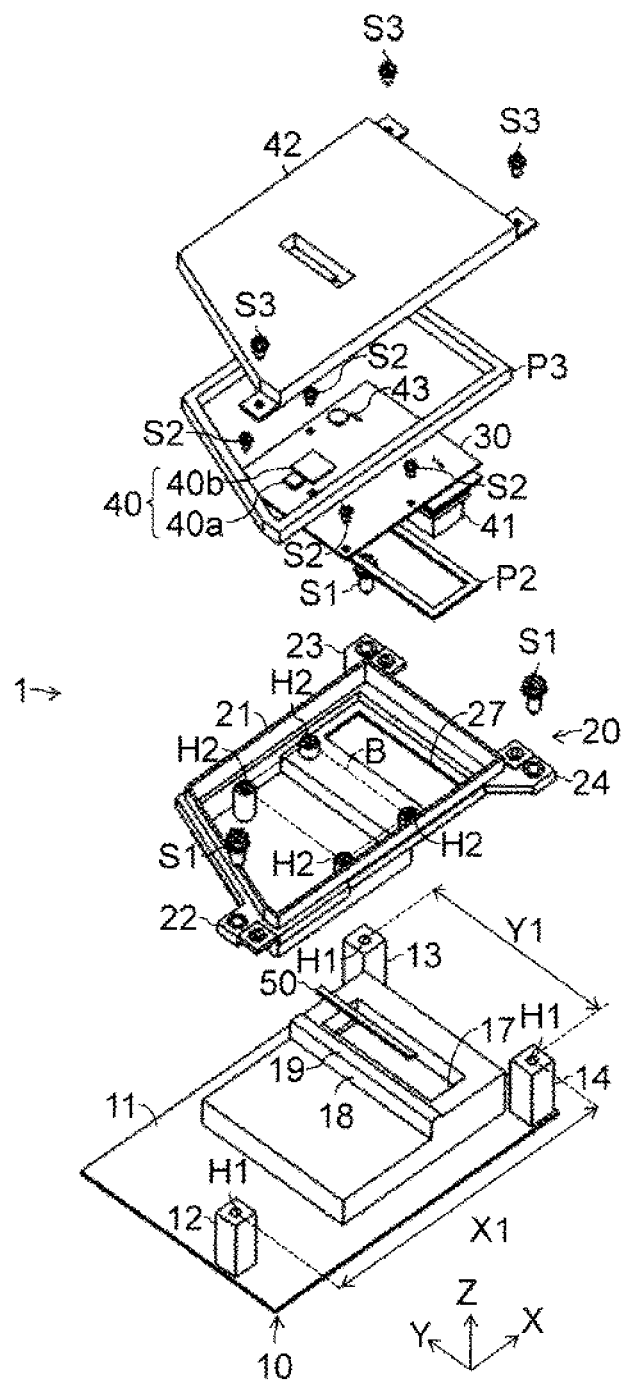
FIG. 25 is an exploded perspective view of an electronic control device according to a twelfth embodiment of the present invention, which corresponds to FIG. 4 in the first embodiment.

FIG. 25 is an exploded perspective view of an electronic control device according to a twelfth embodiment of the present invention, and corresponds to FIG. 4 of the first embodiment.

The present embodiment is different from the second embodiment in that only three fixing screws S1 for fixing the case 20 to the base 10 are provided. Therefore, in the present embodiment, the screw seats 15 and 16 of the base 10 and the brackets 25 and 26 of the case 20 are omitted. In the present embodiment, since the two fixing screws S1 corresponding to the screw seats 15 and 16 in the first embodiment are omitted, the maximum pitch X1 of the fixing screws S1 in the longitudinal direction of the region A is wider than that in the second embodiment, and the maximum pitch X1 is, for example, 150 mm or more. In the present embodiment, other components are the same as those of the second embodiment.

By restraining the case 20 by the adhesive 50, it is possible to realize the fixing structure of the case 20 using the three fixing screws S1 as in the present embodiment, in order to secure the required vibration resistance. In general, in a case made of a resin, it is desirable to set the screw pitch to be smaller than 150 mm from the viewpoint of securing the required vibration resistance, and it is actually difficult to use the three fixing screws S1.

On the other hand, in the present embodiment, even when the number of the fixing screws S1 is limited to three, it is possible to secure the required vibration resistance. Since the plane is defined by three points, by limiting the number of fastening portions of the case 20 by the fixing screw S1 to three, even when there is a manufacturing error in the base 10 or the case 20, distortion of the case 20 at the time of fastening the fixing screw S1 hardly occurs. This makes it possible to handle a generation factor of the stress acting on the soldered portion of the electronic component 40, which is more advantageous in terms of improving the solder life.

In addition, with the reduction of the fixing screw S1, it is possible to reduce the screw seat of the base 10 and the bracket and the insert collar of the case 20, and there are advantages such as simplification of the shapes of the base 10 and the case 20 and reduction of the number of components. In addition, it is possible to reduce the number of man-hours required for fastening the screw at the time of assembling the electronic control device 1, by reduction of the fixing screw S1.

In the present embodiment, the case where the number of the fixing screws S1 is changed from 5 to 3 on the premise of the configuration of the second embodiment has been described as an example. However, in the first and third to eleventh embodiments, it is possible to be changed to a structure in which the case 20 is fixed by only 3 fixing screws S1 in the same manner.

MODIFICATION EXAMPLES

As described above in each embodiment as appropriate, a plurality of features of the first to twelfth embodiments can be appropriately selected and combined. Although the case where the base 10 is made of metal and the case 20 is made of a resin has been described, a configuration in which the base 10 is made of a resin and the case 20 is made of metal, or a configuration in which both the base 10 and the case 20 are made of a resin is also conceivable. Although the case where the in-vehicle device 100 is used as a transmission has been described as an example, the configuration of each embodiment can be applicable to an electronic control device fixed and attached to an in-vehicle device such as an engine, a brake, a motor, or the like.

Further, it has been described that the adhesive 50 is disposed at the position corresponding to the antinode of the amplitude in the longitudinal direction (X-axis direction) and the lateral direction (Y-axis direction) of the region A. However, the adhesive 50 can be disposed at the position corresponding to the antinode of the amplitude in the diagonal direction of the region A.

REFERENCE SIGNS LIST 1 electronic control device
10 base
19 seat surface
20 case
30 circuit board
40 electronic component
40a QFN package (electronic component)
40b BGA package (electronic component)
50, 50a-50c, 50A, 50B adhesive
100 in-vehicle device
A region surrounded by a plurality of fixing screws
B region surrounded by a plurality of board screws
g gap interposed between seat surface and case
i, j distance between adhesive and circuit board
S1 fixing screw
S2 board screw
X longitudinal direction
Y lateral direction

The invention claimed is:

1. An electronic control device fixed to an in-vehicle device to be controlled, wherein
the electronic control device is a unit that includes a base attached to the in-vehicle device, a case fixed to the base, a circuit board held by the case, and an electronic component mounted on the circuit board,
at least one of the case and the base is made of a resin,
the case and the base are fixed with a plurality of fixing screws, and
the case and the base are fixed by an adhesive disposed away from the plurality of fixing screws;
wherein
a region surrounded by the plurality of fixing screws has a longitudinal direction and a lateral direction,
the adhesive extends linearly in the lateral direction, and
the adhesive is disposed at a central portion of the region surrounded by the plurality of fixing screws, in the longitudinal direction.

2. The electronic control device according to claim 1, wherein the adhesive is disposed in a region surrounded by the plurality of fixing screws in plan view.

3. The electronic control device according to claim 1, wherein
the base includes a seat surface that faces the case with a gap interposed between the seat surface and the case, in a region surrounded by the plurality of fixing screws, and
the gap interposed between the seat surface and the case is filled with the adhesive.

4. The electronic control device according to claim 1, wherein the adhesive is configured to have a wave shape when viewed in the longitudinal direction.

5. The electronic control device according to claim 1, wherein the adhesive has a Young's modulus of 1 MPa or more.

6. The electronic control device according to claim 1, wherein
the electronic component includes a QFN package, and
the adhesive is disposed so as not to overlap the QFN package in plan view.

7. The electronic control device according to claim 1, wherein a plurality of the adhesives are arranged in the longitudinal direction.

8. The electronic control device according to claim 1, wherein
a region surrounded by the plurality of fixing screws has a longitudinal direction and a lateral direction, and
a plurality of the adhesives are arranged in the lateral direction.

9. The electronic control device according to claim 8, wherein
one of the base and the case is a resin component and another is a metal component,
the adhesive located on an inner side in the lateral direction of the region surrounded by the plurality of fixing screws is located closer to the resin component than the adhesive located on an outer side in the lateral direction.

10. The electronic control device according to claim 8, wherein the adhesive is configured to have a wave shape when viewed in the longitudinal direction.

11. The electronic control device according to claim 1, wherein
the circuit board is fixed to the case with a plurality of board screws, and
the adhesive is disposed so as not to overlap a region surrounded by the plurality of board screws in plan view.

12. The electronic control device according to claim 1, wherein a number of the fixing screws is only three.

13. An electronic control device fixed to an in-vehicle device to be controlled, wherein
the electronic control device is a unit that includes a base attached to the in-vehicle device, a case fixed to the base, a circuit board held by the case, and an electronic component mounted on the circuit board,
at least one of the case and the base is made of a resin,
the case and the base are fixed with a plurality of fixing screws, and
the case and the base are fixed by an adhesive disposed away from the plurality of fixing screws;
wherein
a region surrounded by the plurality of fixing screws has a longitudinal direction and a lateral direction,
the adhesive extends linearly in the lateral direction;
wherein a plurality of the adhesives are arranged in the longitudinal direction;
distances between the plurality of the adhesives and the circuit board are different,
the electronic component includes a BGA package, and
the adhesive that overlaps the BGA package in plan view is farther away from the circuit board than other adhesives.

* * * * *